United States Patent
Miyazaki et al.

(10) Patent No.: US 10,901,060 B2
(45) Date of Patent: Jan. 26, 2021

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara (JP)

(72) Inventors: Mitsue Miyazaki, Des Plaines, IL (US); Satoshi Sugiura, Otawara (JP); Tsutomu Hoshino, Palm Harbor, FL (US); Xiangzhi Zhou, Vernon Hills, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 608 days.

(21) Appl. No.: 15/057,637

(22) Filed: Mar. 1, 2016

(65) Prior Publication Data
US 2017/0254869 A1 Sep. 7, 2017

(51) Int. Cl.
*G01R 33/565* (2006.01)
*G01R 33/48* (2006.01)
*G01R 33/56* (2006.01)

(52) U.S. Cl.
CPC ... *G01R 33/56509* (2013.01); *G01R 33/4818* (2013.01); *G01R 33/5608* (2013.01)

(58) Field of Classification Search
CPC .......... G01R 33/4818; G01R 33/56509; G01R 33/5608; G01R 33/565; G01R 33/48; G01R 33/56
See application file for complete search history.

(56) References Cited

U.S. PATENT DOCUMENTS

| 5,124,649 | A | 6/1992 | Denison et al. |
| 6,393,313 | B1 | 5/2002 | Foo |
| 6,534,981 | B2 | 3/2003 | Uetake et al. |
| 6,600,944 | B2 | 7/2003 | Van Den Brink |
| 6,603,992 | B1 * | 8/2003 | Debbins ............ G01R 33/5601 600/413 |
| 6,745,064 | B2 | 6/2004 | Fuderer et al. |
| 7,479,782 | B2 | 1/2009 | Van Den Brink |

(Continued)

FOREIGN PATENT DOCUMENTS

| EP | 1 236 436 B1 | 4/2010 |
| JP | 3688404 | 8/2005 |

OTHER PUBLICATIONS

John P. Mugler, III, "Potential Degradation in Image Quality Due to Selective Averaging of Phase-Encoding Lines in Fourier Transform MRI", Magnetic Resonance in Medicine 19, 1991, 5 pgs.

(Continued)

*Primary Examiner* — Jermele M Hollington
*Assistant Examiner* — Suresh K Rajaputra
(74) *Attorney, Agent, or Firm* — Oblon, McClelland, Maier & Neustadt, L.L.P.

(57) ABSTRACT

A magnetic resonance imaging apparatus according to an embodiment includes sequence control circuitry and processing circuitry. The sequence control circuitry performs first data acquisition in a full k-space and performs a plurality of second data acquisition in partial k-spaces, each of the partial k-spaces being smaller than the entirety of the full k-space. The processing circuitry generates an image, based on data acquired from the first data acquisition and a plurality of pieces of data acquired from the plurality of second data acquisition.

19 Claims, 12 Drawing Sheets

(56) References Cited

U.S. PATENT DOCUMENTS

| | | | |
|---|---|---|---|
| 8,099,148 B2 | 1/2012 | Madore | |
| 2008/0278162 A1* | 11/2008 | Bookwalter | G01R 33/54 |
| | | | 324/307 |
| 2009/0261827 A1* | 10/2009 | Duerk | G01R 33/4818 |
| | | | 324/309 |
| 2010/0013475 A1* | 1/2010 | Kimura | A61B 5/055 |
| | | | 324/307 |
| 2012/0013336 A1* | 1/2012 | Hetzer | G01R 33/4818 |
| | | | 324/309 |
| 2014/0079305 A1* | 3/2014 | Akcakaya | G01R 33/56509 |
| | | | 382/131 |

OTHER PUBLICATIONS

G. N.Holland, et al., "Selective Phase Encoding Averaging for Motion Artefact Attenuation and Acquisition Time Reduction", Society of Magnetic Resonance in Medicine, vol. 1, 1987, 2 pgs.

\* cited by examiner

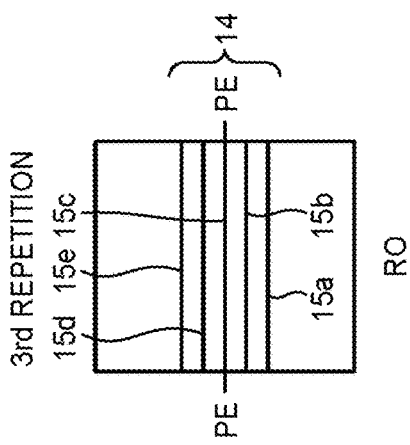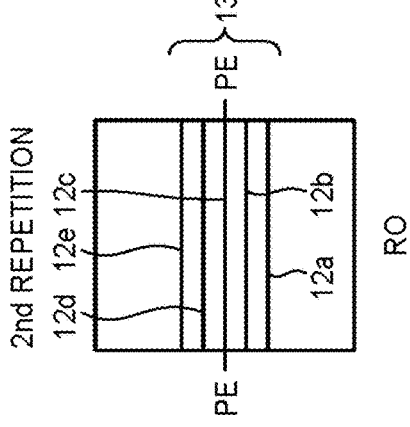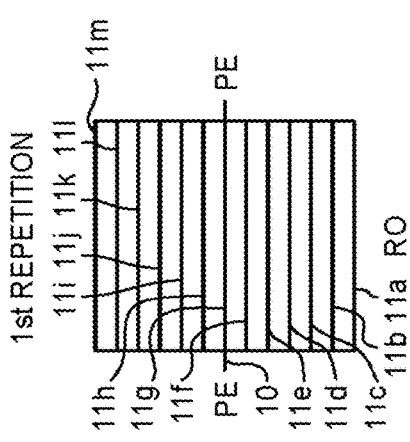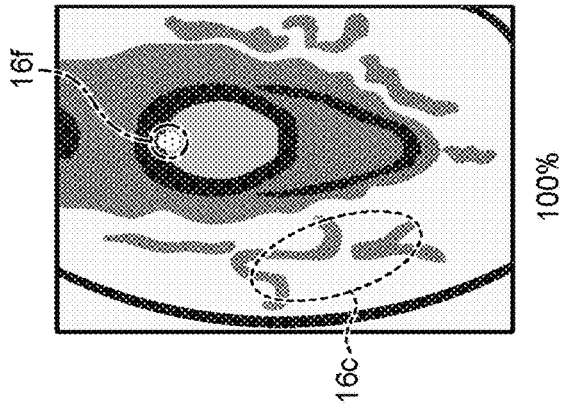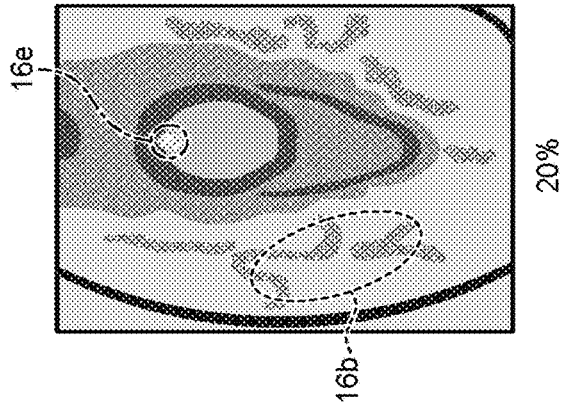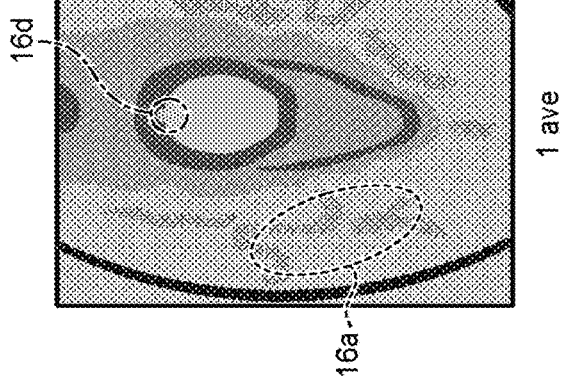

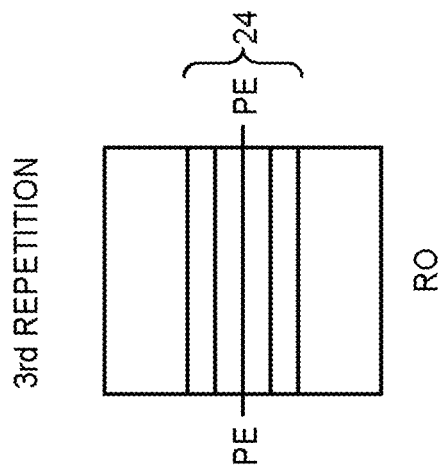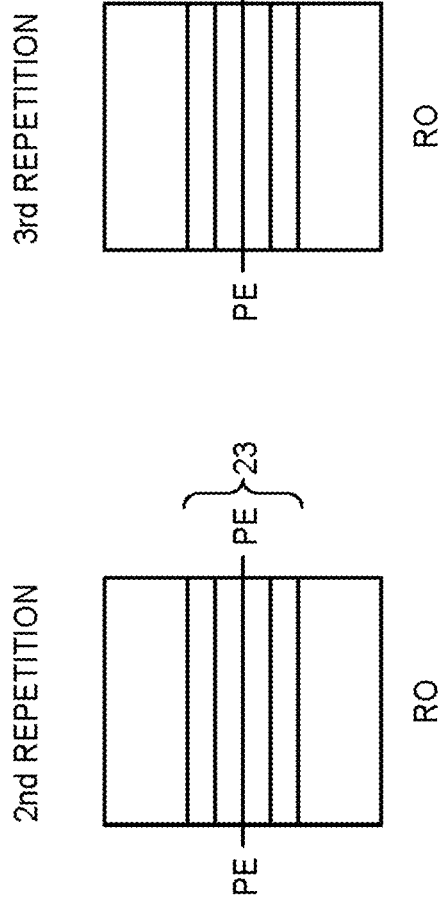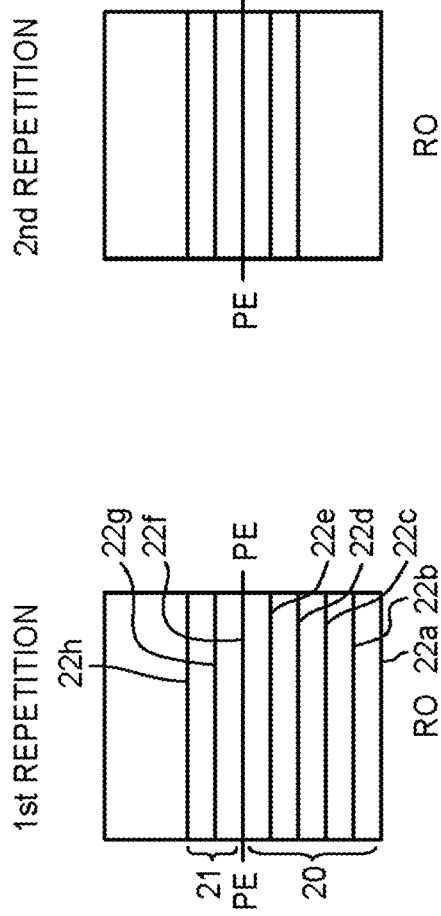

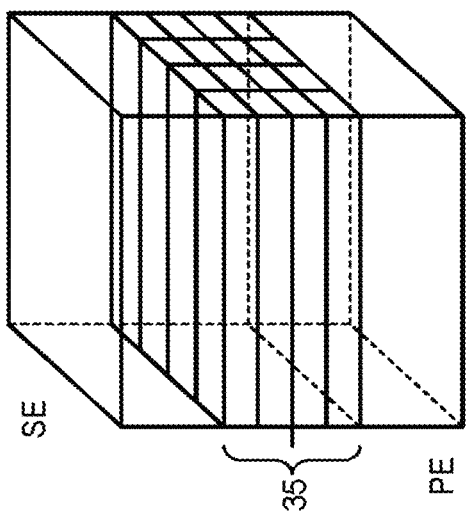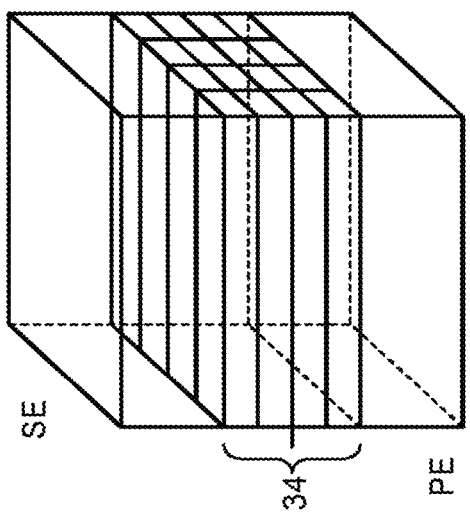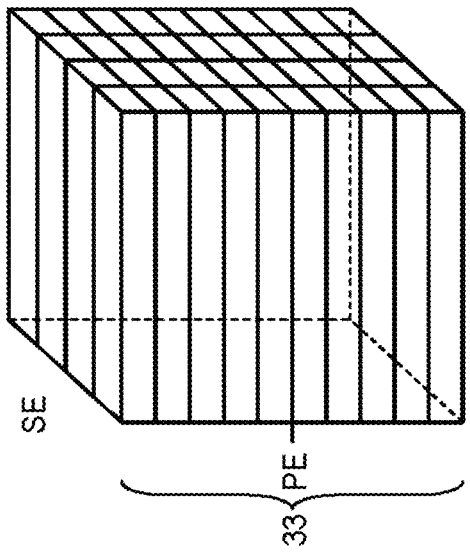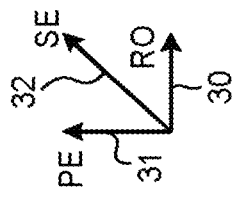
FIG.5A 1st REPETITION
FIG.5B 2nd REPETITION
FIG.5C 3rd REPETITION

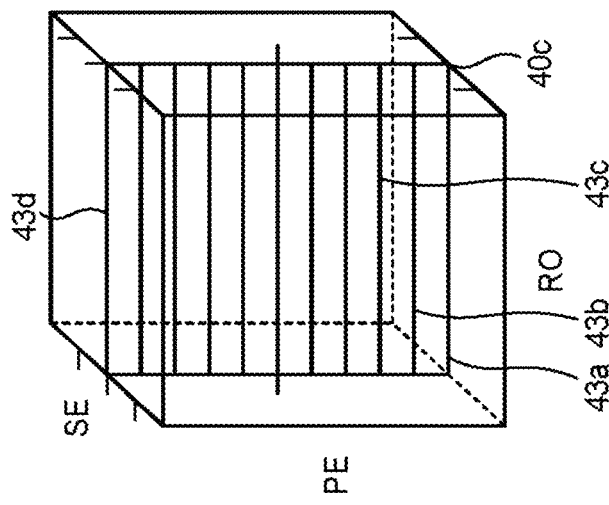
FIG.6A 1st REPETITION
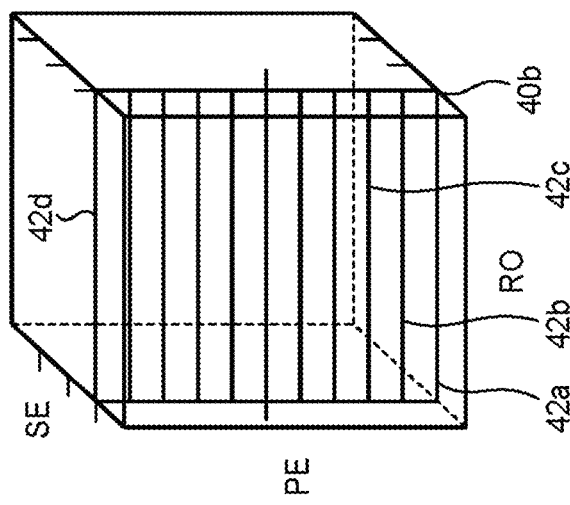
FIG.6B 2nd REPETITION
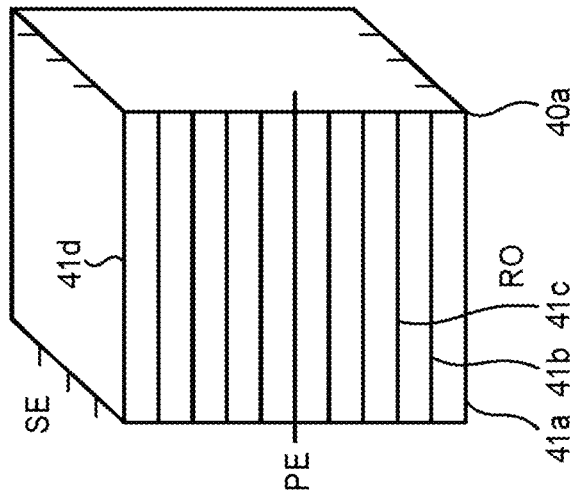
FIG.6C 3rd REPETITION

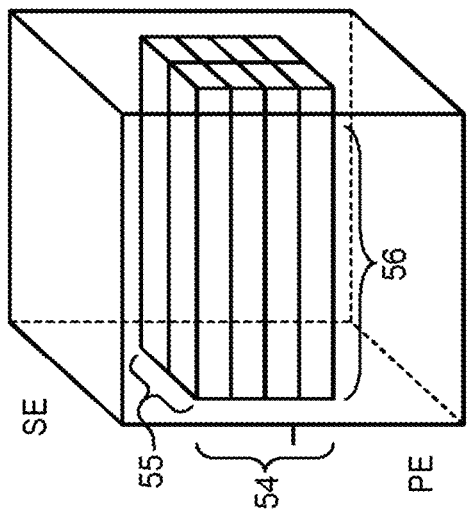
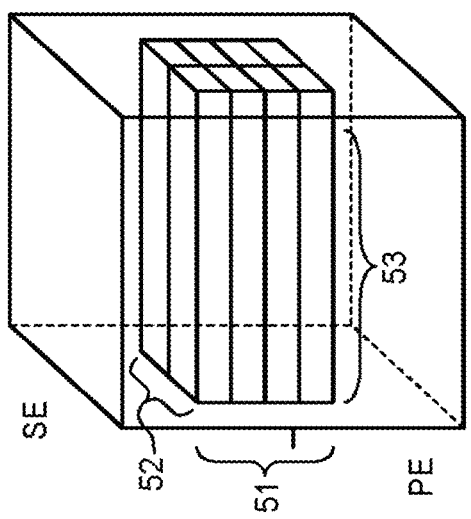
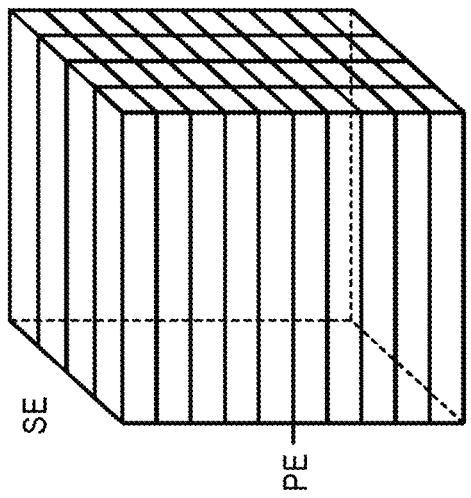

MAGNETIC RESONANCE IMAGING APPARATUS AND MAGNETIC RESONANCE IMAGING METHOD

FIELD

Embodiments described herein relate generally to a magnetic resonance imaging apparatus and a magnetic resonance imaging method.

BACKGROUND

In magnetic resonance imaging of the brain, for example, physiological noise appears in addition to the thermal noise and scanner noise. Physiological noise is noise arising from, for example, metabolic-linked brain physiology and brain pulsations. In other words, although contained within the fixed skull, the brain is pulsatile in reality due to the incessant changes of cerebral blood flow or interstitial fluid caused by the variation in blood pressure over the cardiac cycle.

In order to eliminate physiological noise, signal averaging is used in which data acquisition of the full k-space is performed for a plurality of times. Thereafter, a plurality of pieces of data obtained from the plurality of times of the full k-space data acquisition is averaged to generate an image.

However, data acquisition of the full k-space for a plurality of times necessitates a prolonged data acquisition time, during which the brain is randomly in motion. Thus, contrary to expectations, the image becomes degraded because of accumulation of this type f motion artifacts.

BRIEF DESCRIPTION OF THE DRAWINGS

FIG. 2A, FIG. 2B and FIG. 2C are drawings illustrating processing of a magnetic resonance imaging apparatus according to the first embodiment;

FIG. 2D, FIG. 2E and FIG. 2F are drawings illustrating processing performed by a magnetic resonance imaging apparatus according to the first embodiment.

FIG. 4A, FIG. 4B and FIG. 4C are drawings illustrating processing of a magnetic resonance imaging apparatus according to a first modification example of the first embodiment;

FIG. 5A, FIG. 5E, FIG. 5C, FIG. 6A, FIG. 6B and FIG. 6C are drawings illustrating processing of a magnetic resonance imaging apparatus according to a second modification example of the first embodiment;

FIG. 7A, FIG. 7B and FIG. 7C are drawings illustrating processing of a magnetic resonance imaging apparatus according to a third modification example of the first embodiment;

DETAILED DESCRIPTION

A magnetic resonance imaging apparatus according to an embodiment includes sequence control circuitry and processing circuitry. The sequence control circuitry performs first data acquisition in a full k-space and performs a plurality of second data acquisition in partial k-spaces, each of the partial k-spaces being smaller than the entirety of the full k-space. The processing circuitry generates an image, based on data acquired from the first data acquisition and a plurality of pieces of data acquired from the plurality of second data acquisition.

Exemplary embodiments of a magnetic resonance imaging apparatus and a magnetic resonance imaging method will be explained below with reference to accompanying drawings. Possible embodiments are not limited to exemplary embodiments described below. In principle, the description of each exemplary embodiment is applicable to any other embodiment as well.

First Embodiment

Figure 1:
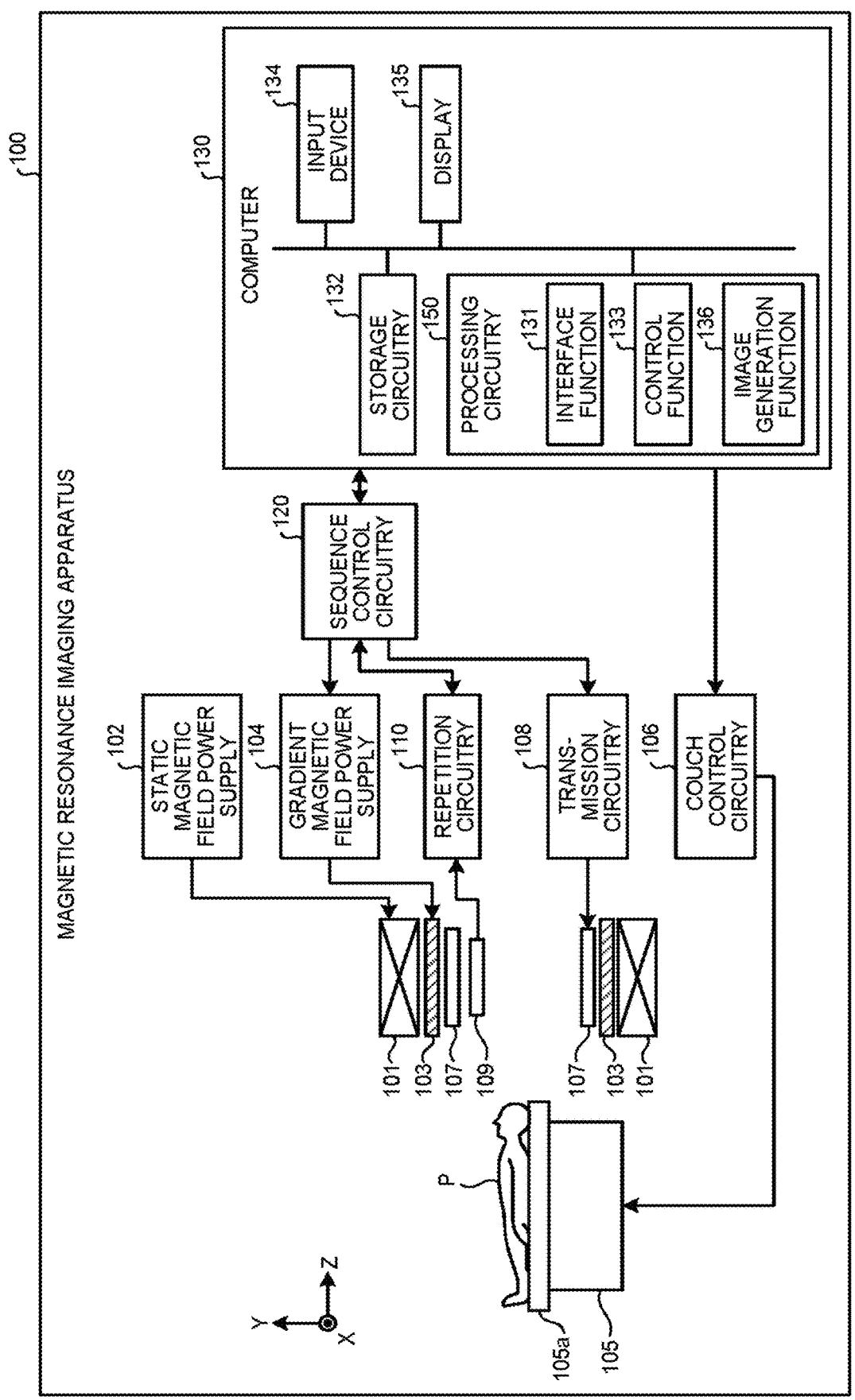
FIG. 1 is a block diagram illustrating a magnetic resonance imaging apparatus according to a first embodiment.

FIG. 1 is a block diagram of a magnetic resonance imaging apparatus 100 according to a first embodiment. As illustrated in FIG. 1, the magnetic resonance imaging apparatus 100 includes a static magnetic field magnet. 101, a static magnetic field power source 102, a gradient coil 103, a gradient magnetic field power source 104, a couch 105, couch control circuitry 106, a transmission coil 107, transmission circuitry 108, a reception coil 109, reception circuitry 110, sequence control circuitry 120, and a computer 130 (which may be called an "image processing apparatus"). The magnetic resonance imaging apparatus 100 does not include an examined subject (such as a human body) P. The configuration illustrated in FIG. 1 is merely an example. In another example, any of the unit included in the sequence control circuitry 120 and the computer 130 may be integrated together or separated, as appropriate.

The static magnetic field magnet 101 is a magnet formed in e shape of a substantially hollow circular cylinder and generates a static magnetic field in a space on an inside thereof. The static magnetic field magnet 101 may be configured by using, for example, a superconducting magnet and is magnetically excited by receiving supply of electric current from the static magnetic field power source 102. The static magnetic field power source 102 supplies electric current to the static magnetic field magnet 101. Alternatively, the static magnetic field magnet 101 may be a permanent magnet, in which case the magnetic resonance imaging apparatus 100 need not comprise the static magnetic field power source 102. Further, the static magnetic field power source 102 may be provided separately from the magnetic resonance imaging apparatus 100.

The gradient coil 103 is a coil formed in a shape of a substantially hollow circular cylinder and is disposed on an inside of the static magnetic field magnet 101. The gradient coil 103 is formed by combining three coils corresponding to X-, Y-, and Z-axes that are orthogonal to one another. These three coils individually receive supply of electric current from the gradient magnetic field power source 104 and generate gradient magnetic fields of which the magnetic field intensities change along the X-, Y-, and Z-axes. The gradient magnetic fields on the X-, Y-, and Z-axes that are generated by the gradient coil 103 correspond to, for example, a slice encode gradient magnetic field Gs, a phase encode gradient magnetic field Ge, and a readout gradient magnetic field Gr, respectively. The gradient magnetic field power source 104 supplies the electric current to the gradient coil 103.

The couch 105 includes a couchtop 105*a* on which the subject P is placed. Under control of the couch control circuitry 106, while the subject P is placed thereon, the couchtop 105*a* is inserted into a hollow (i.e., an image taking opening) of the gradient coil 103. Normally, the couch 105 is provided so that a longitudinal direction thereof extends parallel to a central axis of the static magnetic field magnet 101. Under control of the computer 130, the couch control circuitry 106 drives the couch 105 so that the couchtop 105*a* moves in longitudinal directions and in up-and-down directions.

The transmission coil 107 is disposed on an inside of the gradient coil 103 and generates a radio frequency magnetic field by receiving a supply of a radio frequency (RF) pulse from the transmission circuitry 108. The transmission circuitry 108 supplies an RF pulse corresponding to Larmor frequency determined by a type of targeted atoms and magnetic field intensities, to the transmission coil 107.

The reception coil 109 is disposed on an inside of the gradient coil 103 and receives magnetic resonance signals (hereinafter, "MR signals", as necessary) emitted from the subject P subjected to an influence of a radio frequency magnetic field. Upon reception of magnetic resonance signals, the reception coil 109 outputs the received magnetic resonance signals to the reception circuitry 110.

The transmission coil 107 and the reception coil 109 described above are mere examples. The configuration thereof may be realized by selecting one of the following or combining together two or more of the following: a coil having only a transmission function; a coil having only a reception function; and a coil having transmission and reception functions.

The reception circuitry 110 detects the magnetic resonance signals output from the reception coil 109 and generates magnetic resonance data based on the detected magnetic resonance signals. More specifically, the reception circuitry 110 generates the magnetic resonance data by applying a digital conversion to the magnetic resonance signals output from the reception coil 109. Further, the reception circuitry 110 transmits the generated magnetic resonance data to the sequence control circuitry 120. The reception circuitry 110 may be provided on a gantry device side where the static magnetic field magnet 101, the gradient coil 103, and the like are provided.

The sequence control circuitry 120 images the subject 5, by driving the gradient magnetic field power source 104, the transmission circuitry 108, and the reception circuitry 110, on the basis of sequence information transmitted from the computer 130. The sequence information is information that defines a procedure of the imaging. The sequence information defines: an intensity of electric current to be supplied from the gradient magnetic field power source 104 to the gradient coil 103 and a timing with which electric current is to be supplied; an intensity of an RF pulse to be supplied by the transmission circuitry 108 to the transmission coil 107 and the timing with which an RF pulse is to be applied; a timing with which magnetic resonance signals are to be detected by the reception circuitry 110, and the like. The sequence control circuitry 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU).

Further, upon reception of magnetic resonance data from the reception circuitry 110 as a result of imaging of the subject P by driving the gradient magnetic field power source 104, the transmission circuitry 108, and the reception circuitry 110, the sequence control circuitry 120 forwards the received magnetic resonance data to the computer 130.

The computer 130 exercises overall control of the magnetic resonance imaging apparatus 100, or generates an image, and the like. The computer 130 comprises storage circuitry 132, an input device 134, a display 135 and processing circuitry 150. The processing circuitry 150 includes an interface function 131, a control function 133 and an image generation function 136.

In the first embodiment, each processing function carried out at the interface function 131, the control function 133, the image generation function 136, is stored in the storage circuitry 132 in a form of an executable program by a computer. The processing circuitry 150 is a processor realizing a function corresponding to each program by reading a program from the storage circuitry 132 and thereafter executing the program. In other words, the processing circuitry 150 in a state of having read each program has each function illustrated within the processing circuitry 150 in FIG. 1. It is noted that, in FIG. 1, it is explained that the single processing circuitry 150 realizes the processing function carried out at the interface function 131, the control function 133, or the image generation function 136. However, a plurality of independent processors may constitute the processing circuitry 150, each processor of the processing circuitry 150 executing its own program. In other words, each function described above may constitute a program and the single processing circuitry may execute each program. Alternatively, a specific function may be implemented in an independent program execution circuitry dedicated for the specific function.

Terminology "processor" used in the above explanation is meant to refer to, for example, CPU (Central Processing Unit), GPU (Graphical Processing Unit), or ASIC (Application Specific Integrated Circuit), circuitry such as programmable logic device (i.e. SPLD (Simple Programmable Logic Device), CPLD (Complex Programmable Logic Device) and FPGA (Field Programmable Gate Array). A processor reads and executes a program stored in the storage circuitry 132, thereby realizing the function.

Further, instead of being stored in the storage circuitry 132, a program may be constructed such that it is directly incorporated within circuitry of a processor. In that situation, the processor realizes a function by reading and executing the program incorporated within the circuitry. The couch control circuitry 106, the transmission circuitry 108, the reception circuitry 110 may be constructed as well, with a use of electronic circuits such as processors described above.

The processing circuitry 150 sends sequence information to the sequence control circuitry 120 by the interface function 131 and receives magnetic resonance data from the sequence control circuitry 120. Further, upon reception of the magnetic resonance data, the processing circuitry 150 stores the received magnetic resonance data into the storage circuitry 132 by the interface function 131. When receiving the magnetic resonance data, the processing circuitry 150 having the interface function 131 stores the received magnetic resonance data in the storage circuitry 132.

The magnetic resonance data stored in the storage circuitry 132 is arranged into a k-space by the control function 133. As a result, the storage circuitry 132 stores therein k-space data.

The storage circuitry 132 stores therein the magnetic resonance data received by the processing circuitry 150 that has the interface function 131, the k-space data arranged in the k-space by the processing circuitry 150 having the control function 133, image data generated by the processing circuitry 150 having the image generation function 136, and the like. For example, the storage circuitry 132 is configured by using a Random Access Memory (RAM), a semiconductor memory element such as a flash memory, a hard disk, an optical disc, and the like.

The input device 134 receives various types of instructions and inputs of information from an operator. For example, the input device 134 is a pointing device such as a mouse or a trackball, a selecting device such as a mode changing switch, or an input device such as a keyboard. Under the control of the processing circuitry 150 that has the control function 133, the display 135 displays Graphical User Interface (GUI) used for receiving an input of an image taking condition and an image generated by the processing circuitry 150 that has the image generation function 136, and the like. For example, the display 135 is a display device such as a liquid crystal display device.

The processing circuitry 150 exercises overall control of the magnetic resonance imaging apparatus 100 by the control function 133 and controls image capturing processing, image generation processing, image display processing, and the like. For example, the processing circuitry 150 that has the control function 133 receives an input of the image taking condition (e.g., an image taking parameter) via the GUI and generates sequence information according to the received image taking condition. Further, the processing circuitry 150 that has the control function 133 transmits the generated sequence information to the sequence control circuitry 120.

The processing circuitry 150 reads k-space data from the storage circuitry 132 by the image generation function 136 and generates an image through a reconstructing process such as Fourier transform on the read k-space data.

Next, background of a magnetic resonance imaging apparatus according to an embodiment is briefly explained.

In magnetic resonance imaging, there is a technique known as signal averaging. Signal averaging is a method to improve the SNR (Signal to Noise Ratio) by averaging a plurality of full k-space data acquired by the sequence control circuitry 120. Roughly speaking, the SNR is expected to increase by the square root of the number of repetitions. On the other hand, the total data acquisition time, which is the price to pay, has a cost proportional to the number of repetitions.

In this context, some experimentation using phantoms has been performed to verify the effectiveness of averaging technique in, for example, cerebral imaging, which ended in conclusions that signal averaging amplifies a certain type of artifacts, thus less favorable. Thus, few people choose signal averaging in cerebral imaging.

However, this experimentation using phantoms becomes an armchair theory when it comes to actual brain imaging. The brain, being a living organism, is constantly in motion. More specifically, in magnetic resonance imaging of the brain, for example, physiological noise appears in addition to the thermal noise and scanner noise. Physiological noise is noise arising from, for example, metabolic-linked brain physiology and brain pulsations. In other words, although contained within the fixed skull, the brain is pulsatile in reality due to the incessant changes of cerebral blood flow or interstitial fluid caused by the variation in blood pressure over the cardiac cycle.

Physiological noise, being a random noise, is cancelled out well by signal averaging. Thus, signal averaging is beneficial. On the contrary, phantoms do not have physiological noise because they are inanimate. Thus, signal averaging is less beneficial.

In this context, in order to eliminate physiological noise, signal averaging is used in which data acquisition of the full k-space is performed for a plurality of times. Thereafter, a plurality of pieces of data obtained from the plurality of times of the full k-space data acquisition is averaged to generate an image.

However, data acquisition of the full k-space for a plurality of times necessitates a prolonged data acquisition time, during which the brain is randomly in motion. Thus, contrary to expectations, the image becomes degraded because of accumulation of this type of motion artifacts.

This teaches one a lesson that, consuming as much time as possible to improve the image resolution is no panacea for high quality images. On the contrary, there exists an optimal time for a high quality image under a given pulse sequence. To put it another way, in one aspect, in order to improve the image resolution, data acquisition time that is necessary grows longer. Thus, it is preferable that the data acquisition time be long. In another aspect, if the data acquisition time is too long, the image gets degraded due to the overall motion during the period. As a result, signal averaging becomes less effective. Thus, it is preferable that the sequence control circuitry 120 finish the data acquisition no later than the optimum time.

In this context, in order to shorten the data acquisition time compared to the case of normal signal averaging (averaging a plurality of full k-space data), the sequence control circuitry 120 according to the first embodiment performs a plurality of data acquisition in partial k-space, in addition to at least one data acquisition in the full k-space. Data acquisition in partial k-space is less time-consuming than that in the full k-space. At the same time, a plurality of data acquisition is performed in total, which makes it possible to take advantage of the benefit of signal averaging.

Moreover, an appropriate GUI (Graphical User Interface) to be disclosed in the subsequent embodiments facilitates a user to choose the optimum time for data acquisition, which makes it possible to choose the optimal imaging condition.

Figure 3:
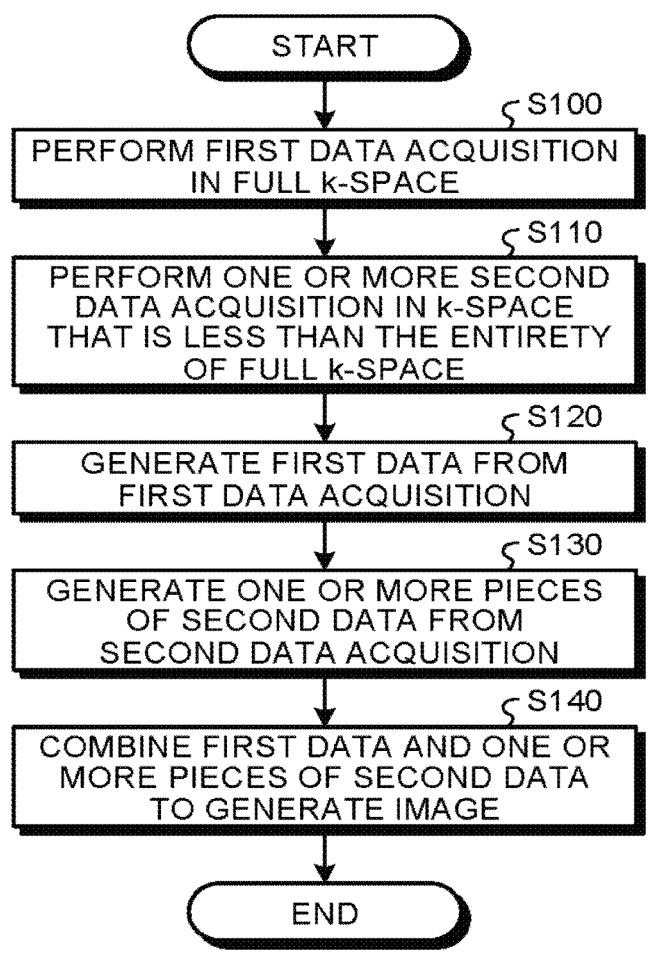
FIG. 3 is a flowchart illustrating a procedure of processing performed by a magnetic resonance imaging apparatus according to the first embodiment.

FIG. 2A, FIG. 2B and FIG. 2C are drawings illustrating processing of a magnetic resonance imaging apparatus according to the first embodiment. FIG. 3 is a flowchart illustrating a procedure of processing performed by a magnetic resonance imaging apparatus according to the first embodiment.

In FIG. 2A, FIG. 2B and FIG. 2C, the horizontal direction represents the RO (Readout) direction. The vertical direction represents the PE (Phase Encoding) direction. Each of FIG. 2A, FIG. 2B and FIG. 2C indicates two-dimensional k-space in which the sequence control circuitry 120 performs data acquisition in the first repetition, the second repetition and the third repetition, respectively.

In FIG. 2A, a line 10 indicates the center of the k-space in the PE direction. Each of a line 11a, a line 11b, a line 11c, a line 11d, a line 11e, a line 11f, a line 11g, a line 11h, a line 11i, a line 11j, a line 11k, a line 11l, and a line 11m represents a single data acquisition line. This means that the sequence control circuitry 120 performs data acquisition of one line at a time by the pulse sequence executed by the sequence control circuitry 120. In a case in which the sequence control circuitry 120 executes a single echo pulse sequence, the sequence control circuitry 120 performs data acquisition of a single line at a time. On the other hand, in a case in which the sequence control circuitry 120 executes a multi-echo pulse sequence, the sequence control circuitry 120 performs data acquisition of a plurality of lines corresponding to a plurality of echoes that are formed for one excitation pulse.

In FIG. 2B, each of a line 12*a*, a line 12*b*, a line 12*c*, a line 12*d* and a line 12*b* represents a single data acquisition line in the second repetition. A k-space region 13 represents a region in the k-space in which the sequence control circuitry 120 performs data acquisition during the second repetition. In FIG. 2C, each of a line 15*a*, a line 15*b*, a line 15*c*, a line 15*d* and a line 15*e* represents single data acquisition line in the third repetition. A k-space region 14 represents a region in the k-space in which the sequence control circuitry 120 performs data acquisition during the third repetition.

FIG. 3 is a flowchart illustrating a procedure of processing performed by a magnetic resonance imaging apparatus according to the first embodiment. First of all, the sequence control circuitry 120 performs first data acquisition in the full k-space (in other words, first repetition as indicated in FIG. 2A) (Step 100). This situation is illustrated, for example, in FIG. 2A. The choice of the pulse sequence executed by the sequence control circuitry 120 may be arbitrary. To name only but a few, for example, the sequence control circuitry 120 may perform the first data acquisition (and a plurality of second data acquisition) with at least one of a Spin Echo (SE) sequence, a Gradient Echo (GE) sequence, a Fast Spin Echo (FSE) sequence, a Single Shot Fast Spin Echo (SSFSE) sequence, a balanced Steady State Free Precession (bSSFP) sequence, an Echo Planar Imaging (EPI) sequence in Step S100 and the subsequent steps thereof. As an example of the GE sequence, the sequence control circuitry 120 may perform the first data acquisition and the plurality of second data acquisition with an Ultra Short Echo Time (UTE) sequence.

The sequence control circuitry 120, for example, performs data acquisition of the two-dimensional k-space in the centric order. In other words, the sequence control circuitry 120 starts data acquisition from the center and extends outward. In this case, with reference to FIG. 2A, the sequence control circuitry 120 starts data acquisition from the line 11*g*, moving on to the line 11*f*, 11*h*, 11*e*, 11*i*, 11*d*, 11*j*, 11*c*, 11*k*, 11*b*, 11*l*, 11*a*, 11*m*, in this order. Alternatively, the sequence control circuitry 12C may perform data acquisition in the sequential order. In this case, the sequence control circuitry 120 starts data acquisition from the line 11*a*, moving on to the line 11*b*, 11*c*, 11*d*, 11*e*, 11*f*, 11*g*, 11*h*, 11*i*, 11*j*, 11*k*, 11*l*, 11*m*, in this order. Alternatively, the sequence control circuitry 120 may perform data acquisition in an interleaved fashion. In this case, the sequence control circuitry 120 starts data acquisition from the line 11*a*, moving on to the line 11*c*, 11*e*, 11*g*, 11*i*, 11*k*, 11*m*, 11*b*, 11*d*, 11*f*, 11*h*, 11*i*, 11*l*, in this order.

Subsequently, the sequence control circuitry 120 performs one or more second data acquisition in a k-space that is less than the entirety of the full k-space (Step S110). For example, the sequence control circuitry 120 performs a plurality of second data acquisition in partial k-spaces, each of the partial k-spaces being smaller than the entirety of the full k-space. More specifically, the partial k-spaces may be the same in the plurality of second data acquisition. In this case, the sequence control circuitry 120 performs a plurality of second data acquisition in a partial k-space that is smaller than the entirety of the full k-space. Alternatively, each of the partial k-spaces may be different in the plurality of second data acquisition. To it another way, at least two of the partial k-spaces may differ from each other.

It is additionally noted that, for the convenience of explanation, in FIG. 2B and FIG. 2C, the number of repetitions in the second data acquisition is two (in other words, the total number of repetitions is three). However, embodiments are not limited to this situation and the number of repetitions may be arbitrary.

As in FIG. 2B, the sequence control circuitry 120 performs data acquisition in the k-space region 13 during the second repetition. The sequence control circuitry 120 performs data acquisition line by line, for example, starting from the line 12*c* and moving on to the line 12*b*, the line 12*d*, the line 12*a* and the line 12*e*, in this order. The sequence control circuitry 120 performs, for example, "30%" of the full k-space during the second repetition and the third repetition. As in FIG. 2C, the sequence control circuitry 120 performs data acquisition in the k-space region 14 during the third repetition. The sequence control circuitry 120 performs data acquisition line by line, for example, starting from the line 15*c* and moving on to the line 15*b*, the line 15*d*, the line 15*a* and the line 15*e*, in this order.

The reason the sequence control circuitry 120 performs data acquisition in the partial k-space during the second and the third repetition is the following: The center part of the k-space has more information value than the cuter part of the k-space. As described above, data acquisition in the full k-space is time-consuming. Thus, the sequence control circuitry 120 performs data acquisition only in the center part of the k-space to reduce an overall data acquisition time, while maintaining image quality to a certain extent.

After the sequence control circuitry 120 finishes first data acquisition in the full k-space at Step S100, the processing circuitry 150 generates first data from the first data acquisition performed by the sequence control circuitry 120 (Step S120). Moreover, after the sequence control circuitry 120 finishes the one or more second data acquisition in the partial k-space, the processing circuitry 150 generates one or more pieces of second data from the one or more second data acquisition (Step S130).

Subsequently, the processing circuitry 150 combines the first data generated by the processing circuitry 150 at Step S120 and the one or more pieces of second data generated by the processing circuitry 150 at Step S150, thereby generating an image (Step S140). In other words, the processing circuitry 150 generates an image, based on data acquired from the first data acquisition and a plurality of pieces of data acquired from the plurality of second data acquisition. Specifically, for example, the processing circuitry 150 simply averages the data acquired from the first data acquisition and the plurality of pieces of data acquired from the plurality of second data acquisition, thereby generating the image. Alternatively, the processing circuitry 150 may perform a weighted summation to the data acquired from the first data acquisition and the plurality of pieces of data acquired from the plurality of second data acquisition, thereby generating an image.

FIG. 2D, FIG. 2E and FIG. 2F are drawings illustrating processing performed by a magnetic resonance imaging apparatus according to the first embodiment. In FIG. 2D, only one full k-space data acquisition has been performed by the sequence control circuitry 120 ("1 ave"). In FIG. 2E, five "20%" partial k-space data acquisition in addition to one full k-space data acquisition has been performed by the sequence control circuitry 120 ("20%"). In FIG. 2F, five full ("100%") k-space data acquisition in addition to one full k-space data acquisition has been performed by the sequence control circuitry 120 ("100%"). As will be described below, an oval-shaped region 16a in FIG. 2D, an oval-shaped region 16b and an oval-shaped region 16c in FIG. 2F indicate a region in which better definition or apparent contrast between white matter (WM) and gray matter (GM) is given by the reduction of random noise. A circled region 16d in FIG. 2D, a circled region 16e and a circled region 16f indicate a region in which clearer definition of the image is given with averaging technique being employed, compared to the case of one full k-space data acquisition (i.e. no averaging).

In FIG. 2E or in FIG. 2F, compared to the case of one full k-space data acquisition ("1 ave"), physiological noise is reduced, both in the case of five "20%" partial k-space data acquisition and in the case of five "100%" k-space data acquisition. As illustrated in the oval-shaped region 16a in FIG. 2D, in the oval-shaped region 16b in FIG. 2E, or in the oval-shaped region 16c in FIG. 2F, both in the case of five "20%" partial k-space data acquisition and in the case of five "100%" k-space data acquisition, the SNR is improved with random noise being cancelled. Consequently, apparent contrast between white matter (WM) and gray matter (GM) is enhanced. As illustrated in the circled region 16d in FIG. 2D, in the circled region 16e in FIG. 2E and in the circled region 16f in FIG. 2F, both in the case of five "20%" partial k-space data acquisition and in the case of five "100%" partial k-space data acquisition, clear images are obtained within regions inside the circles.

In the embodiments described above, Step S130 is followed by Step S120. However, embodiments are not limited to this situation. For example, the processing circuitry 150 may perform the processing of Step S130 prior to Step S120, and subsequently perform the processing of Step S120. Moreover, the processing circuitry 150 may perform the processing of Step S120 prior to Step S110, after the sequence control circuitry 120 performs the processing of Step S100. In addition, the processing circuitry 150 may perform the processing of Step S130 prior to Step S120, after the sequence control circuitry 120 performs the processing of Step S110. The sequence control circuitry 120 may perform the processing of Step S110 prior to Step S100.

Moreover, the processing described above may be combined with flow-spoiled Fresh Blood Imaging (FBI) or Time-Spatial Labeling Inversion Pulse (Time-SLIP) method with less RR interval as well.

Embodiments are not limited to the case described above. For example, at Step S140, a case is explained in which the processing circuitry 150 simply averages the data acquired from the first data acquisition and the plurality of pieces of data acquired from the plurality of second data acquisition. The processing circuitry 150 may perform more advanced processing. For example, rather than just averaging "raw data", the processing circuitry 150 may perform a reconstruction from each of the plurality of pieces of data acquired from the plurality of second data acquisition and thereafter perform a motion correction to the pieces of reconstructed data. At this stage, the processing circuitry 150 performs a summation over the pieces of motion-corrected reconstructed data as a summation of images. The motion correction processing includes rigid deformation where distances between every pair of pixels are preserved or non-rigid deformation.

In the first embodiment, the sequence control circuitry 120 performs first data acquisition in the full k-space and performs a plurality of second data acquisition in a partial k-space. Compared to full k-space signal averaging, partial k-space signal averaging is advantageous in terms of data acquisition time. On the other hand, compared to one full k-space data acquisition, a plurality of partial k-space data acquisition is robust against physiological noise as well as background noise. Thus, a magnetic resonance imaging apparatus according to the first embodiment can perform imaging with improved image quality.

First Modification Example of the First Embodiment

FIG. 4A, FIG. 4B and FIG. 4C are drawings illustrating processing of a magnetic resonance imaging apparatus according to a first modification example of the first embodiment. In the first embodiment, a basic example in which the sequence control circuitry 120 performs first data acquisition in the full k-space at least once and performs a plurality of second data acquisition in a partial k-space is explained. In the first modification example of the first embodiment, partial Fourier technique is employed.

In FIG. 4A, FIG. 4B and FIG. 4C, the horizontal direction represents RO (Readout) direction. The vertical direction represents PE (Phase Encoding) direction. Each of the FIG. 4A, FIG. 4B and FIG. 4C indicates the two-dimensional k-space in which the sequence control circuitry 120 performs data acquisition in the first repetition, the second repetition and the third repetition, respectively.

In FIG. 4A, each of a line 22a, a line 22b, a line 22c, a line 22d, a line 22e, a line 22f and a line 22g represents a single data acquisition line. This means that the sequence control circuitry 120 performs data acquisition of one line for one echo that is formed by the pulse sequence executed by the sequence control circuitry 120.

The k-space region 20 represents a k-space that is the lower half of the k-space in which data acquisition is performed with a use of partial Fourier technique by the sequence control circuitry 120 during the first repetition. The k-space region 21 represents a k-space that is in the central part of the k-space belonging to the upper half of the k-space in which extra data acquisition is performed during the first repetition by the sequence control circuitry 120 to improve image quality.

In FIG. 4B, a k-space region 23 represents a region in the k-space in which the sequence control circuitry 120 performs data acquisition during the second repetition. In FIG. 4C, a k-space region 24 represents a region in the k-space in which the sequence control circuitry 120 performs data acquisition during the third repetition.

With reference to FIG. 3 again, the procedure of the processing of a magnetic resonance imaging apparatus according to the first modification example of the first embodiment is explained.

First of all, the sequence control circuitry 120 performs first data acquisition in the full k-space during the first repetition (Step S1001. This situation is illustrated, for example, in FIG. 4A. Here, in the first modification example of the first embodiment, the sequence control circuitry 120 employs partial Fourier technique during the first data acquisition and a plurality of second data acquisition subsequently performed. As an example, the sequence control circuitry 120 executes a Fast Asymmetric Spin Echo (FASE) sequence during the first data acquisition. A FASE pulse sequence is a high-speed imaging sequence employing partial Fourier technique (half-Fourier technique) to reduce the number of phase-encoding, thereby reducing the total time necessary for data acquisition. Partial Fourier technique is imaging technique utilizing the fact that k-space data has a specific symmetry called the Hermitian symmetry. Due to the Hermitian symmetry, mirror images across the origin of the k-space need not be acquired, thus the total data acquisition time becomes halved.

It is noted here that for the case of partial Fourier technique, the word "the full k-space" means, for example, the half of the k-space. For example, the word "the full k-space" indicates either an upper half of the k-space or a lower half of the k-space or any other possible halves of the k-space. In practice the sequence control circuitry 120 performs data acquisition in more than "the full k-space" of this definition, which will be explained in the later paragraphs.

The sequence control circuitry 120, for example, performs data acquisition of the two-dimensional k-space in the centric order. With reference to FIG. 4A, for example, the sequence control circuitry 120 starts data acquisition from the line 22e, moving on to the line 22d, line 22f, etc., in this order. Alternatively, the sequence control circuitry 120 may perform data acquisition in a sequential order.

In theory, it suffices to say that the sequence control circuitry 120 performs data acquisition in exactly the half of the k-space. However, in practice, the sequence control circuitry 120 may perform data acquisition in more than the half of the k-space including the central part of the k-space having larger information value than other parts of the k-space. This situation is illustrated for example, in FIG. 4A. As illustrated in FIG. 4A, the sequence control circuitry 120 performs data acquisition in the k-space region 20, which is the normal k-space region to be basically acquired by partial Fourier technique by the sequence control circuitry 120. On the other hand, the sequence control circuitry 120 performs data acquisition in the k-space region 23, which is an extra k-space region to be optionally acquired by partial Fourier technique by the sequence control circuitry 120.

Subsequently, the sequence control circuitry 120 performs one or more second data acquisition in a k-space that is less than the entirety of the full k-space (Step S110). For example, the sequence control circuitry 120 performs a plurality of second data acquisition in a partial k-space that is smaller than the entirety of the full k-space.

For example, the sequence control circuitry 120 performs data acquisition in the k-space region 23 during the second repetition, as illustrated in FIG. 4B. The sequence control circuitry 120 performs data acquisition in the k-space region 24 during the third repetition, as illustrated in FIG. 4C.

After the sequence control circuitry 120 finishes first data acquisition in "the full k-space" at Step S100, the processing circuitry 150 generates first data from the first data acquisition performed by the sequence control circuitry 120 (Step S120). After the sequence control circuitry 120 finishes the one or more second data acquisition in the partial k-space, the processing circuitry 150 generates one or more pieces of second data from the one or more second data acquisition (Step S130).

Subsequently, the processing circuitry 150 combines the first data generated by the processing circuitry 150 at Step S120 and the one or more pieces of second data generated by the processing circuitry 150 at Step S130, thereby generating an image (Step S140).

In the first modification example of the first embodiment, partial Fourier technique is used. With this embodiment, a magnetic resonance imaging apparatus according to the first modification example of the first embodiment can approximately halve the data acquisition time.

Second Modification Example of the First Embodiment

In the previous embodiments, cases in which 20 data acquisition is performed by the sequence control circuitry 120 are explained. In the second modification example of the first embodiment, the sequence control circuitry 120 performs 3D data acquisition. FIG. 5A, FIG. 5D, FIG. 5C, FIG. 6A, FIG. 6B and FIG. 6C are drawings illustrating processing of a magnetic resonance imaging apparatus according to the second modification example of the first embodiment.

FIG. 5A, FIG. 5F and FIG. 5C are drawings illustrating processing of a magnetic resonance imaging apparatus according to the second modification example of the first embodiment. In FIG. 5A, FIG. 5F and FIG. 5C, a left-right direction 30 indicates the RO (Readout) direction. A vertical direction 31 indicates the PE (Phase Encoding) direction. An anterior-posterior direction 32 indicates the SE (Slice Encoding) direction. A full k-space region 33 in FIG. 5A indicates the full k-space region in which data acquisition is performed by the sequence control circuitry 120 during the first repetition. A partial k-space region 34 in FIG. 5B indicates the partial k-space region in which data acquisition is performed by the sequence control circuitry 120 during the second repetition. A partial k-space region 35 in FIG. 5C indicates the partial k-space region in which data acquisition is performed by the sequence control circuitry 120 during the third repetition.

FIG. 6A, FIG. 6B and FIG. 6C are drawings illustrating processing of a magnetic resonance imaging apparatus according to the second modification example of the first embodiment. FIG. 6A, FIG. 6B and FIG. 6C indicate how 3D data acquisition is performed. Similarly to FIG. 5A, FIG. 5B and FIG. 5C, the left-right direction in FIG. 6A, FIG. 6B and FIG. 6C indicates the RO (Readout) direction. The vertical direction in FIG. 6A, FIG. 6B and FIG. 6C indicates the PE (Phase Encoding) direction. The anterior-posterior direction indicates the SE (Slice Encoding) direction. Each of a line 41a, a line 41b, a line 41c and a line 41d indicates a single data acquisition line. A data plane 40a indicates a data plane (a two-dimensional plane) in which data acquisition is performed by the sequence control circuitry 120 during the data acquisition of the data plane indicated by FIG. 6A. The terminology "data plane" refers to a frequency domain encoded data plane of the 3D k-space, in contrast with the word "slice" that refers to a slice in the real-space.

Similarly, in FIG. 6B, each of a line 42a, a line 42b, a line 42c and a line 42d indicates a single data acquisition line. In FIG. 6C, each of a line 43a, a line 43b, a line 43c and a line 43d indicates a single data acquisition line. A slice 40b in FIG. 6B indicates a data plane (a two-dimensional plane) in which data acquisition is performed by the sequence control circuitry 120 during the data acquisition of the data plane indicated by FIG. 6B. A data plane 40c in FIG. 6C indicates a data plane (a two-dimensional plane) in which data acquisition is performed by the sequence control circuitry 120 during the data acquisition of the data plane indicated by FIG. 6C.

With reference to FIG. 3 again, the procedure of the processing of a magnetic resonance imaging apparatus according to the second modification example of the first embodiment is explained.

First of all, the sequence control circuitry 120 performs first data acquisition in the 3D full k-space during the first repetition (Step S100). The sequence control circuitry 120 performs 3D data acquisition as indicated by FIG. 6A, FIG. 6B and FIG. 6C. In FIG. 6A, FIG. 6B and FIG. 6C, 3D data acquisition is performed sequentially in the SE direction by the sequence control circuitry 120. However, embodiments are not limited to this situation and other form of data acquisition in the slice encoding direction such as centric or interleaved data acquisition may be possible.

The sequence control circuitry 120 starts the 3D data acquisition, for example, beginning with the data plane 40a as indicated by FIG. 6A. Within the data plane 40a, the sequence control circuitry 120 performs a plurality of lines of data acquisition including, for example, the line 41a, the line 41b, the line 41c and the line 41d. The sequence control circuitry 120, for example, performs 2D data acquisition (one data plane in the overall 3D volume) for a predetermined data plane position as indicated by the data plane 40a. The sequence control circuitry 120 performs, for example, data acquisition in the centric order in the PE direction. Alternatively, the sequence control circuitry 120 performs data acquisition in the sequential order or an interleaved fashion in the PE direction.

Upon completion of data acquisition of the data plane 40a as indicated by FIG. 6A, the sequence control circuitry 120 moves on to data acquisition of the data plane 40b as indicated by FIG. 6B. Within the data plane 40b, the sequence control circuitry 120 performs a plurality of lines of data acquisition including, for example, the line 42a, the line 42b, the line 42c and the line 42d. Upon completion of data acquisition of the data plane 40c as indicated by FIG. 6B, the sequence control circuitry 120 moves on to data acquisition of the data plane 40c as indicated by FIG. 6C. Within the data plane 40c, the sequence control circuitry 120 performs a plurality of lines of data acquisition including, for example, the line 43a, the line 43b, the line 43c and the line 43d.

In this way, the 3D full k-space data acquisition is completed as illustrated in FIG. 5A by the sequence control circuitry 120.

Upon completion of the 3D full k-space data acquisition, the sequence control circuitry 120 performs one or more second data acquisition in a 3D partial k-space (Step S110). In other words, the sequence control circuitry 120 performs a plurality of second data acquisition in a partial k-space that is signal than the entirety of the full k-space, the partial k-space being a 3D k-space having a smaller size in at least one of the Phase Encoding (PE) direction and the lice Encoding (SE) direction than the 3D full k-space. In the following, the size of the k-space is reduced along the PE direction. However, embodiments are not limited to this situation. Embodiments may be applicable as well to a case in which the size of the k-space is reduced along the SE direction.

As an example, the sequence control circuitry 120 performs 3D data acquisition in the partial k-space region 34 during the second repetition as indicated by FIG. 5B. The sequence control circuitry 120 performs 3D data acquisition in the partial k-space region 35 during the third repetition as indicated by FIG. 5C.

After the sequence control circuitry 120 finishes first data acquisition in the full 3D k-space at Step S100, the processing circuitry 150 generates first data from the first data acquisition performed by the sequence control circuitry 120 (Step S120). After the sequence control circuitry 120 finishes the one or more second data acquisition in the partial 3D k-space, the processing circuitry 150 generates one or more pieces of second data from the one or more second data acquisition (Step S130).

Subsequently, the processing circuitry 150 combines the first data generated by the processing circuitry 150 at Step S120 and the one or more pieces of second data generated by the processing circuitry 150 at Step S130, thereby generating image(s) (Step S140). For example, in 3D data acquisition, the processing circuitry 150 generates multiple images.

Embodiments are not limited to the case described above. The case is explained in which the processing circuitry 150 performs 3D data acquisition. However, the processing circuitry 150 may perform multi-slice 2D data acquisition instead of 3D data acquisition, in which the substitution is straightforward.

Third Modification Example of the First Embodiment

In the second modification example of the first embodiment, the sequence control circuitry 120 performs partial 3D k-space data acquisition in which the size of the k-space is reduced either of in the PE direction or the SE direction. In the third modification example of the first embodiment, the size of the k-space is reduced both in the PE direction and in the SE direction during the partial 3D data acquisition by the sequence control circuitry 120. The sequence control circuitry 120 may employ partial Fourier technique to perform data acquisition. Alternatively the sequence control circuitry 120 may employ technique that is other than the partial Fourier technique.

FIG. 7A, FIG. 7B and FIG. 7C are drawings illustrating processing of a magnetic resonance imaging apparatus according to a third modification example of the first embodiment. Each of FIG. 7A, FIG. 7B and FIG. 7C indicates 3D k-space in which data acquisition is performed by the sequence control circuitry 120 during the first repetition, the second repetition and the third repetition, respectively.

The left-right direction in FIG. 7A, FIG. 7B and FIG. 7C indicates the RO (Readout) direction. The vertical direction in FIG. 7A, FIG. 7B and FIG. 7C indicates the PE (Phase Encoding) direction. The anterior-posterior direction in FIG. 7A, FIG. 7B and FIG. 7C indicates the SE (Slice Encoding) direction. In FIG. 7B, an RO k-space size 53 indicates the k-space size in the RO direction during the second repetition. A PE k-space size 51 indicates the k-space size in the PE direction during the second repetition. A SE k-space size 52 indicates the k-space size in the SE direction during the second repetition. In FIG. 7C, each of an RO k-space size 56, a PE k-space size 54 and a SE k-space size 55 indicates the k-space size in the RO direction, in the PE direction and in the SE direction, respectively.

With reference to FIG. 3 again, the procedure of the processing of a magnetic resonance imaging apparatus according to the third modification example of the first embodiment is explained.

First of all, the sequence control circuitry 120 performs first data acquisition in the 3D full k-space during the first repetition (Step S100). The sequence control circuitry 120 performs 3D data acquisition as indicated by FIG. 7A, FIG. 7D and FIG. 7C.

Upon completion of the 3D full k-space data acquisition as indicated by FIG. 7A, the sequence control circuitry 120 performs one or more second data acquisition in a 3D partial k-space (Step S110). More specifically, the sequence control circuitry 120 performs a plurality of second data acquisition in a partial k-space that is smaller than the entirety of the full k-space, the partial k-space being a 3D k-space having a smaller size in the PE (Phase Encoding) direction and the SE (Slice Encoding) direction than the 3D full k-space.

As an example, the sequence control circuitry 120 performs 3D data acquisition in the partial k-space region during the second repetition as indicated by FIG. 7C, the partial k-space region being a 3D k-space having the small PE k-space size 51, the small SE k-space size 52 and the constant RO k-space size. The sequence control circuitry 120 performs 3D data acquisition in the partial k-space region during the third repetition as indicated by FIG. 7C, the partial k-space region being a 3D k-space having the small PE k-space size 54, the small SE k-space size 55 and the constant RO k-space size.

After the sequence control circuitry 120 finishes first data acquisition in the full 3D k-space at Step S100, the processing circuitry 150 generates first data from the first data acquisition performed by the sequence control circuitry 120 (Step 2120). After the sequence control circuitry 120 finishes the one or more second data acquisition in the partial 3D k-space, the processing circuitry 150 generates one or more pieces of second data from the one or more second data acquisition (Step S130).

Subsequently, the processing circuitry 150 combines the first data generated by the processing circuitry 150 at Step S120 and the one or more pieces of second data generated by the processing circuitry 150 at Step S130, thereby generating image(s) (Step S140). For example, in 3D data acquisition, the processing circuitry 150 generates multiple slice images.

Other Modification Examples of the First Embodiment

Embodiments are not limited to the above-described embodiments. For example, the sequence control circuitry may perform at least one of the first data acquisition and the plurality of second data acquisition with a plurality of reception coils included in the reception circuitry 110. In this case, the processing circuitry 150, for example, uses parallel imaging technique to generate an image. With a use of data acquisition from a plurality of coils combined with the parallel imaging technique, further reduction of data acquisition time is expected to become possible. Parallel imaging technique is technique for acquiring a reconstruction image with a reduced data acquisition time. In parallel imaging technique, data acquisition is usually performed with a reduced number of lines in the k-space compared to full sampling, thus data acquisition time becomes reduced. However, the reduced number of data points gives rise to aliasing in the reconstructed image, for which parallel imaging technique compensates by acquiring data with a plurality of reception coils, followed by reconstruction technique to remove aliasing from the signals. As for the parallel imaging technique, for example, methods such as Sensitivity Encoding (SENSE), Generalized Autocalibrating Partially Parallel Acquisition (GRAPPA) and Simultaneous Acquisition of Spatial Harmonics (SMASH) are in use. Alternatively, the processing circuitry 150 may use Compressed Sensing (CS) to generate an image.

Furthermore, the sequence control circuitry may perform motion correction to generate an image, either prospectively or retrospectively. Prospective motion correction is method attempting to reduce motion artifacts at the time of data acquisition by measuring the motion of the subject in real time, in conjunction of a dynamical update of the imaging protocol to track the motion of the subject. In this case, the sequence control circuitry 120 performs a prospective motion correction during at least one of the first data acquisition and the plurality of second data acquisition. On the other hand, retrospective motion correction is a method of improving the image quality by post-processing methods. In this case, the processing circuitry 150 performs a retrospective motion correction to generate the image after the data acquisition is finished. The pros and cons of a prospective motion correction and a retrospective motion correction are that a retrospective motion correction is relatively easier to implement with improvement of image quality to a certain degree but unable to remove all types of motion artifacts while a prospective motion correction is relatively laborious but capable of eliminating a wider range of motion artifacts.

Second Embodiment

In the above-described embodiments, various types of partial k-space acquisition in combination of full k-space acquisition are explained. From the second embodiment to the fourth embodiment, GUIs (Graphical User Interfaces) are added to a magnetic resonance imaging apparatus according to at least one of the previous embodiments.

Figure 8:
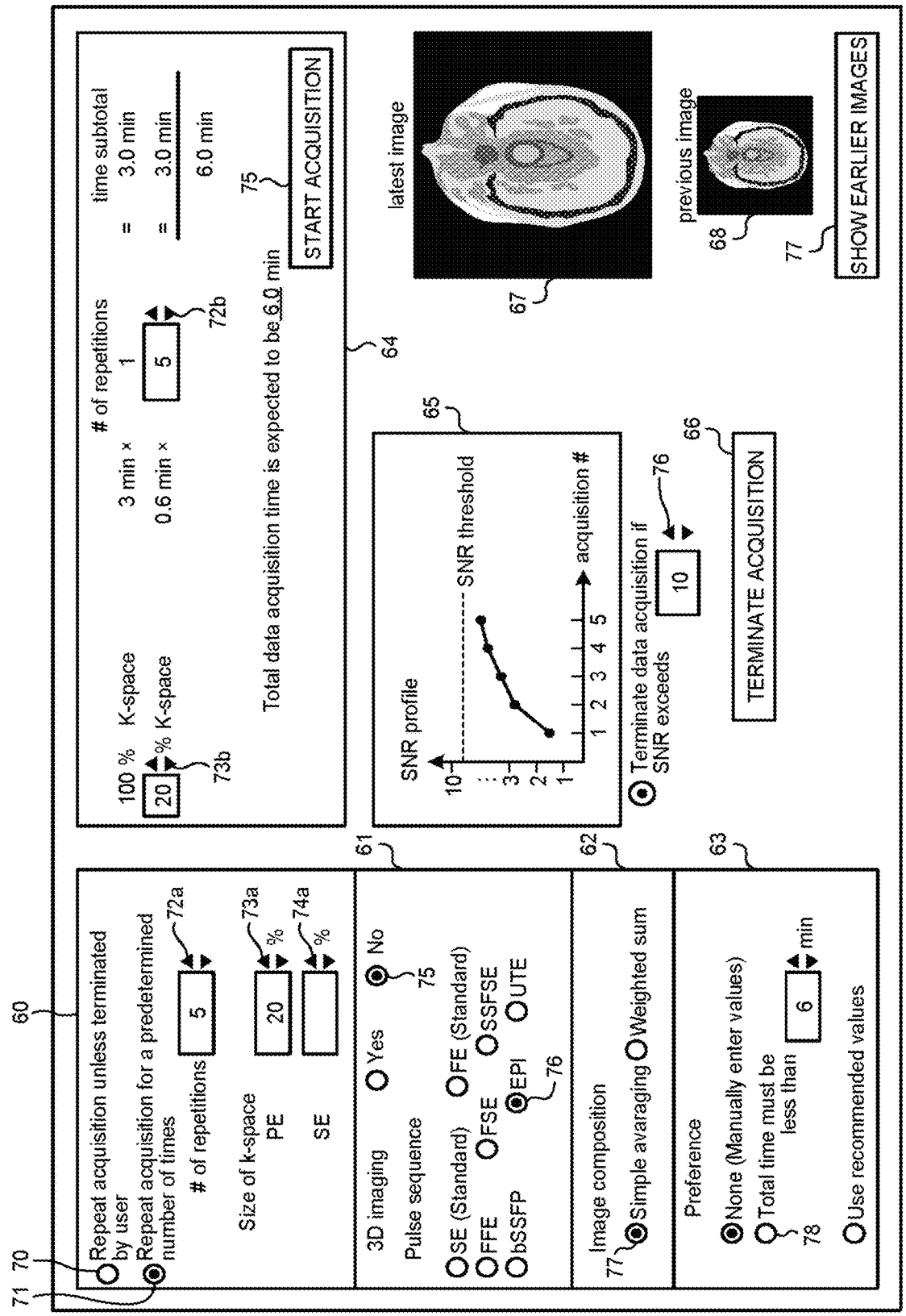
FIG. 8 is a drawing illustrating an example of a GUI (Graphical User Interface) according to a magnetic resonance imaging apparatus according to a second embodiment, a third embodiment or a fourth embodiment.

FIG. 8 is a drawing illustrating an example of a GUI (Graphical User Interface) according to a magnetic resonance imaging apparatus according to the second embodiment, the third embodiment or the fourth embodiment.

In FIG. 8, a panel 60 represents a panel accepting an input of parameters of the data acquisition sequence from users and displaying the current parameter values. A panel 61 represents a panel for accepting a selection of the pulse sequence. A panel 62 represents a panel for a configuration of post-processing methods. A panel 63 represents a panel for a more detailed configuration. A panel 64 is a panel displaying users an estimated data acquisition time and optionally interactively accepting a user input. A panel 67 is a panel on which the latest image is displayed to facilitate the users' real-time review of the image and intervention. A panel 68 is a panel on which the previous image is displayed for a comparison. A button 77 is a button to display earlier images upon request from the users.

In the panel 60, a button 70 is a button accepting a user input requesting that data acquisition be endlessly repeated unless terminated by users. A button 71 is a button accepting a user input requesting that second data acquisition be performed for a predetermined number of times. A button 72a is a button accepting a user input requesting that the number of repetitions of the second data acquisition (partial k-space data acquisition) be increased or decreased. Each of a button 73a and a button 74a is a button accepting a user input requesting that the size of the partial k-space in which the plurality of second data acquisition is performed in the PE direction and in the SE direction, respectively, be increased or decreased.

In the panel 61, a button 75 is a button accepting a user input as to whether 3D imaging be performed or not be performed. A button 76 is a button accepting from users the choice of the pulse sequence to be executed.

In the panel 63, a button 78 is a button accepting a user input requesting that total data acquisition time be not more than a predetermined threshold.

In the panel 64, a button 72b is a button accepting a user input requesting that the number of repetitions of the second data acquisition (partial k-space data acquisition) be increased or decreased. The button 72b and the button are the same, except that the button 72b is embedded in the panel 64 notifying users of the estimated data acquisition time. A button 73b is a button accepting a user input requesting that the size of the partial k-space in which the plurality of second data acquisition is performed in the PE direction be increased or decreased. The button 73a and the button 73b are the same, except that the button 73b is embedded in the panel 64 notifying users of the estimated data acquisition tune.

Figure 9:
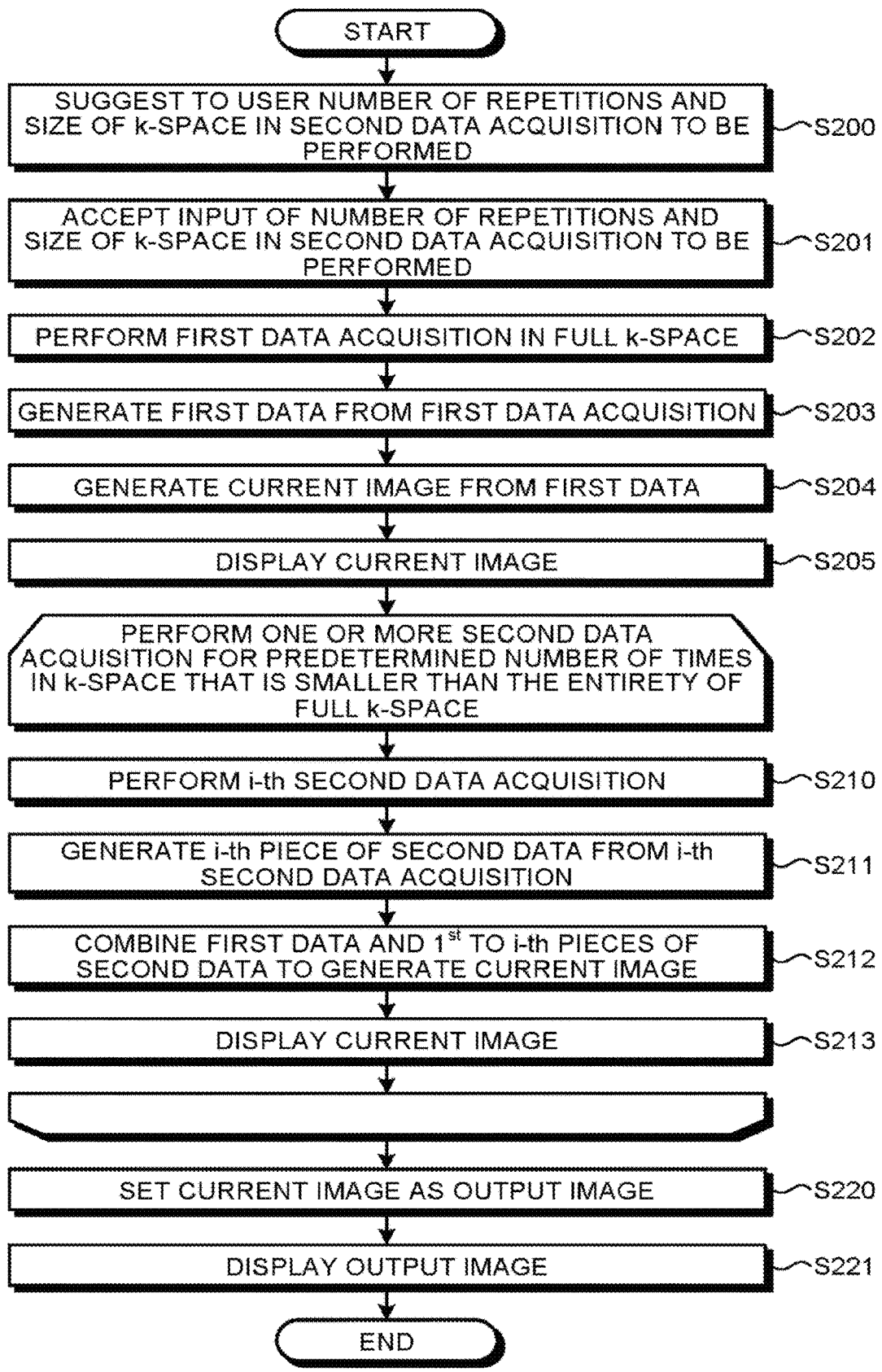
FIG. 9 is a flowchart illustrating a procedure of processing performed by a magnetic resonance imaging apparatus according to the second embodiment.

FIG. 9 is a flowchart illustrating a procedure of processing performed by a magnetic resonance imaging apparatus according to the second embodiment.

First of all, prior to the subsequent data acquisition, the processing circuitry 15C suggests to users the number of repetitions and/or the size of the k-space in the second data acquisition to be performed. In other words, the processing circuitry 150 causes the display 135 to display a recommendation value of at least one of a number of repetitions in the plurality of second data acquisition to be performed and a size of the partial k-space in which the plurality of second data acquisition is performed. For example, based on a database or values that are set as default values, the processing circuitry 150 estimates recommendation values for a given pulse sequence and imaging conditions. For example, based on the database included in the storage circuitry 132, the processing circuitry 150 determines that the number of repetitions be "5" and that the size of the partial k-space in which the plurality of second data acquisition is performed be "20%" compared to the full k-space. Alternatively, by the button 76, the processing circuitry 150 may accept a user input requesting that the total data acquisition time be not more than a predetermined threshold, such as 6 minutes. In this case, the processing circuitry 150 determines the values of the number of repetitions and the size of the partial k-space such that the expected total data acquisition time does not exceed 6 minutes. The processing circuitry 150 causes the display 135 to display such parameters as the recommendation values for the pulse sequence.

In this process, for example, the processing circuitry 150 causes the display 135 to display the expected total data acquisition time. On the panel 64 in FIG. 8, for example, the display 135 displays the expected total data acquisition time for the recommendation values. For example, the sequence control circuitry 120 performs first data acquisition in "100%" of the k-space (the full k-space). As the number of repetition is one and it takes 3.0 minutes per one data acquisition, the total time necessary for the first data acquisition is 3.0 minutes. The sequence control circuitry 120 performs a plurality of second data acquisition, each of the second data acquisition being "20%" of the k-space. As the number of repetitions is five and as it takes 0.6 minutes per one second data acquisition, the total time necessary for the plurality of second data acquisition is 3.0 minutes. Thus, the total data acquisition time is expected to be 6.0 minutes. The display 135 displays, for example on the panel 64, that the total data acquisition time is expected to be 6.0 minutes.

Next, when the processing circuitry 150 suggests to users the number of repetitions and the size of the k-space in the second data acquisition to be performed by the sequence control circuitry 120, the processing circuitry 150 accepts an input of the number of repetitions and the size of the k-space in the second data acquisition to be performed by the sequence control circuitry 120 (Step S200). In other words, the processing circuitry 150 accepts from users, prior to the plurality of second acquisition, an input of the number of repetitions in the plurality of second data acquisition or the size of the partial k-space in which the plurality of second data acquisition is performed. As an example, if the user agrees with the recommendation values, the user presses the button 75 on the panel 64. In this way, the processing circuitry 150 accepts from users, the input of the number of repetitions and the size of the partial k-space. In another example, if the user wants to increase or decrease the number of repetitions, the user clicks on the button 72b on the panel 64 or the button 72a on the panel 60 to modify the number of repetitions. The processing circuitry 150 accepts from users, the input of the modified number of repetitions. If the user wants to increase or decrease the size of the partial k-space, the user clicks on the button 73b on the panel 64 or on the button 73a on the panel 60 to modify the size of the partial k-space. The processing circuitry 150 accepts from users, the input of the modified size of the partial k-space.

The processing circuitry 150 accepts inputs of other parameters as well. For example, by the panel 61, the processing circuitry 150 accepts inputs as to whether or not to perform 3D data acquisition, or as to the choice of the pulse sequence. For example, by the panel 62, the processing circuitry 150 accepts inputs about the post-processing. By the panel 63, the processing circuitry 150 accepts input about more advanced configuration.

When the processing circuitry 150 accepts, in Step S201, the input of the number of repetitions and the size of the k-space in the second data acquisition to be performed, the sequence control circuitry 120 performs the first data acquisition in the full k-space (Step S202). Upon completion of the first data acquisition, the processing circuitry 150 generates first data from the first data acquisition performed by the sequence control circuitry 120 (Step S203). This step is essentially the same as Step S120 in FIG. 3. Next, the processing circuitry 150 generates a current image from the first data generated by the processing circuitry 150 at Step S202 (Step S204). The current image means an image generated by the first data only. In other words, the current image here is the image generated from the first data acquisition in the full k-space only.

The processing circuitry 150 causes the display 135 to display the current image. The display 135 displays the current image (Step S205). For example, the processing circuitry 150 causes the display 135 to display the current image on the panel 67.

Next, as is explained in the previous embodiments, the sequence control circuitry performs the one or more second data acquisition for a predetermined number of times in a k-space that is smaller than the entirety of the full-space. During this processing, Step S210 to Step S213 are repeated.

Hereafter, i represents the number of the second data acquisition being acquired and is a variable beginning with 1 and is incremented by 1 for each iteration.

The sequence control circuitry 120 performs the i-th second data acquisition (Step S210). Upon completion of the i-th second data acquisition, the processing circuitry 150 generates an i-th piece of second data from the i-th second data acquisition (Step S211). Subsequently, the processing circuitry 150 combines the first data and the first to i-th pieces of second data, thereby generating a current image (a second image) (Step S212). To put it another way, the processing circuitry 150 concurrently generates a second image during the plurality of second data acquisition, based on data acquired from the first data acquisition and one or more already-acquired pieces of data acquired from the plurality of second data acquisition. For example, if i=1, then the processing circuitry 150 generates the second image (the current image) based on data acquired form the first data acquisition and the first piece of data acquired from the first second data acquisition. If i=3, then the processing circuitry 150 generates the second image (the current image) based on data acquired from the first data acquisition and the first to third pieces of data acquired from the first to third second data acquisition, respectively.

Next, the processing circuitry 150 causes the display 135 to display the second image (the current image) generated at Step S212 by the processing circuitry 150 (Step S213). In other words, the processing circuitry 150 causes the display 135 to display the second image. The display 135 displays the second image. For example, on the panel 67, the processing circuitry 150 causes the display 135 to display the second image as the latest image. The processing circuitry 150 causes the display 135 to optionally display the previous image (the image which was the latest image during the previous iteration step) on the panel 68 for comparison. Furthermore, the processing circuitry 150 may accept a user input requesting to show earlier images. The processing circuitry 150 causes the display 135 to optionally display still earlier images. In other words, the image data displayed on the display 135 is not limited to the final image corresponding to the n times of data acquisition.

Step S210 to Step S213 are repeated for the predetermined number of times until the sequence control circuitry 120 performs all of the plurality of second data acquisition. The processing circuitry 150 sets the current image as the output image (Step S220). The processing circuitry 150 causes the display 135 to display the output image (Step S221). Here, the processing circuitry 150 generates the output image on the fly (i.e. without interrupting the computer program already running) and causes the display 135 to display the output image generated on the fly, refreshing the old image each time in order to keep the image updated.

It is noted that, in parallel with Step S211 to Step S213, the processing circuitry 150 stores the acquired pieces of second data, for example, in the storage circuitry 132.

Embodiments are not limited to the case described above. For example, the update of "the current image" at Step S213 need not be performed, for example, for each second data acquisition. On the contrary, data of "the current image" at Step S213 may be updated line by line for each acquisition. In other words, the processing circuitry 150 need not tarry until all the lines of data acquisition are finished but may perform a reconstruction as soon as one line of data acquisition is completed.

In other words, the phrase "a piece of second data" is construed as a piece of second data corresponding to one line of data acquisition, in a case in which the image is updated line by line. On the other hand, the phrase "a piece of second data" is construed as a piece of second data corresponding to the whole partial k-space, in a case in which the image is updated when data acquisition of the whole partial k-space is completed. Furthermore, the processing circuitry 150 may update the image when data acquisition of a predetermined number of lines of the partial k-space is completed. In such a case, the phrase "a piece of second data" is construed as a piece of second data corresponding to the predetermined number of lines of the partial k-space.

In the second embodiment, the processing circuitry 150 suggests to users the recommendation values of the number of repetitions and the size of the partial k-space in the second data acquisition, prior to the data acquisition performed by the sequence control circuitry 120. In addition, the present GUI allows users to manually control the number of repetitions and the size of the partial k-space in the second data acquisition. Furthermore, users are given an ongoing image feedback during the plurality of partial k-space data acquisition. Thus, a magnetic resonance imaging apparatus according to the second embodiment with at least one of the GUIs provides users with improved user experience and image quality through optimized parameters for the partial k-space data acquisition.

Third Embodiment

In the previous embodiments, the partial k-space data acquisition is repeated for a predetermined number of times. In the third embodiment, the partial k-space data acquisition is repeated endlessly until terminated by the user.

In FIG. 8, the button 70 is a button accepting a user input requesting that data acquisition be endlessly repeated unless terminated by the user. A button 66 is a button accepting a user input requesting that data acquisition be terminated.

Figure 10:
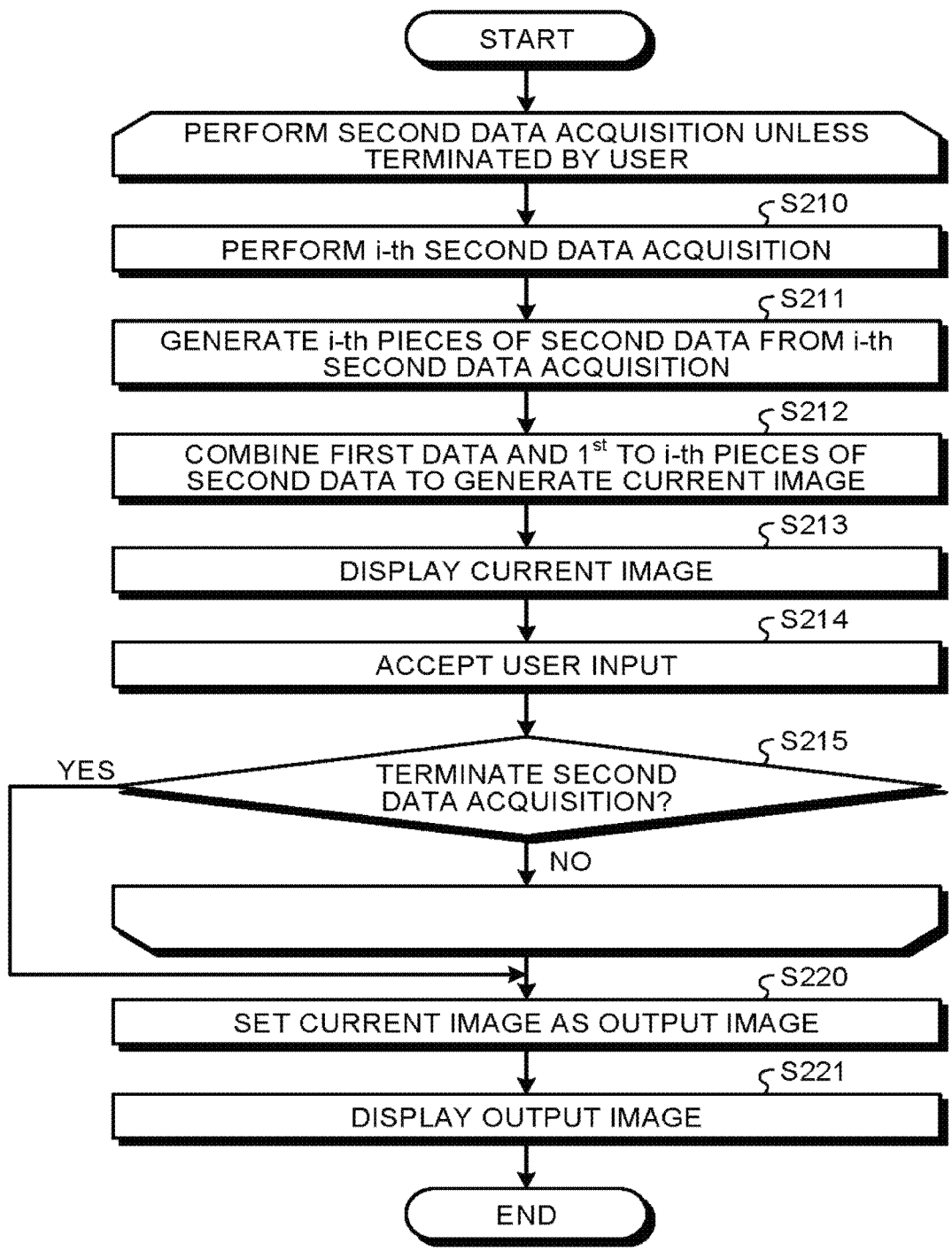
FIG. 10 is a flowchart illustrating a procedure of processing perforated by a magnetic resonance imaging apparatus according to the third embodiment.

FIG. 10 is a flowchart illustrating a procedure of processing performed by a magnetic resonance imaging apparatus according to the third embodiment. FIG. 10 corresponds to Step S210 to Step S221 in FIG. 9. In other words, in the third embodiment, steps corresponding to Step S200 to Step S205 are the same as in the second embodiment. Therefore, explanation of these steps is not repeated.

In FIG. 10, the sequence control circuitry 120 perpetually repeats the second data acquisition unless terminated by the user. In other words, the processing circuitry 150 accepts from a user, an input controlling the sequence control circuitry to terminate the second data acquisition. The sequence control circuitry 120 repeats the second data acquisition until the processing circuitry 150 accepts the input. The sequence control circuitry 120 terminates the second data acquisition when the processing circuitry 150 accepts the input.

Similarly to the second embodiment, the sequence control circuitry 120 performs the i-th second data acquisition (Step S210). Upon completion of the i-th second data acquisition, the processing circuitry 150 generates an i-th piece of second data from the i-th second data acquisition (Step S211). Subsequently, the processing circuitry 150 combines the first data and the first to i-th pieces of second data, thereby generating a current image (a second image). To put it another way, the processing circuitry 150 concurrently generates a second image during the plurality of second data acquisition, based on data acquired from the first data acquisition and one or more already-acquired pieces of data acquired from the plurality of second data acquisition. Next, the processing circuitry 150 causes the display 135 to display the second image (the current image) generated at Step S212 by the processing circuitry 150. In other words, the processing circuitry 150 causes the display 135 to display the second image. The display 135 displays the second image. For example, on the panel 67, the processing circuitry 150 causes the display 135 to display the second image as the latest image. The processing circuitry 150 causes the display 135 to optionally the previous image (the image which was the latest image during the previous iteration step) on the panel 68 for comparison. Furthermore, the processing circuitry 150 may accept a user input requesting to show earlier images.

The processing circuitry 150 accepts a user input (Step S214). This user input is for example, a user input regarding the termination of the second data acquisition. The processing circuitry determines whether or not the user input requesting the termination of the second data acquisition is accepted. For example, when the button 66 in FIG. 8 is pressed by the user, the processing circuitry 150 determines that the user input requesting the termination of the second data acquisition is accepted. If the user input is not accepted by the processing circuitry (Step S215 No), the process returns to step S210 and the sequence control circuitry 120 repeats the second data acquisition. If the user input is accepted by the processing circuitry (Step S215 Yes), the process is aborted and handed down to step S220.

Similarly to the second embodiment, the processing circuitry 150 sets the current image as the output image (Step S220). The processing unit causes the display 135 to display the output image (Step S221).

In FIG. 10, the processing circuitry 150 accepts the user input at Step S214. However, embodiments are not limited to this situation. For example, the processing circuitry 150 may accept the user input at any timing from Step S212 to Step S215. Moreover, the process may be handed down to Step S220 immediately after the user input is accepted by the processing circuitry 150.

In the third embodiment, the number of repetitions of the partial k-space data acquisition is not given in advance. On the contrary, when to terminate the partial k-space data acquisition is left at a user's disposal. This GUI is especially useful where the optimum number of repetitions is not easy to estimate in advance. In this case, a magnetic resonance imaging apparatus according to the third embodiment can provide the user with an image with the optimized number of partial k-space data acquisition.

Fourth Embodiment

In the third embodiment, the partial k-space data acquisition is terminated manually. In the fourth embodiment, the partial k-space data acquisition is terminated automatically or semi-automatically.

In FIG. 8, a panel 65 indicates a panel in which an index indicating the image quality is plotted against the number of repetitions of partial k-space data acquisition. For example, SNR (Signal to Noise Ratio) is plotted against the number of repetitions. A button 76 represents a button to accept a user input requesting the termination threshold of the partial k-space data acquisition be increased or decreased.

Figure 11:
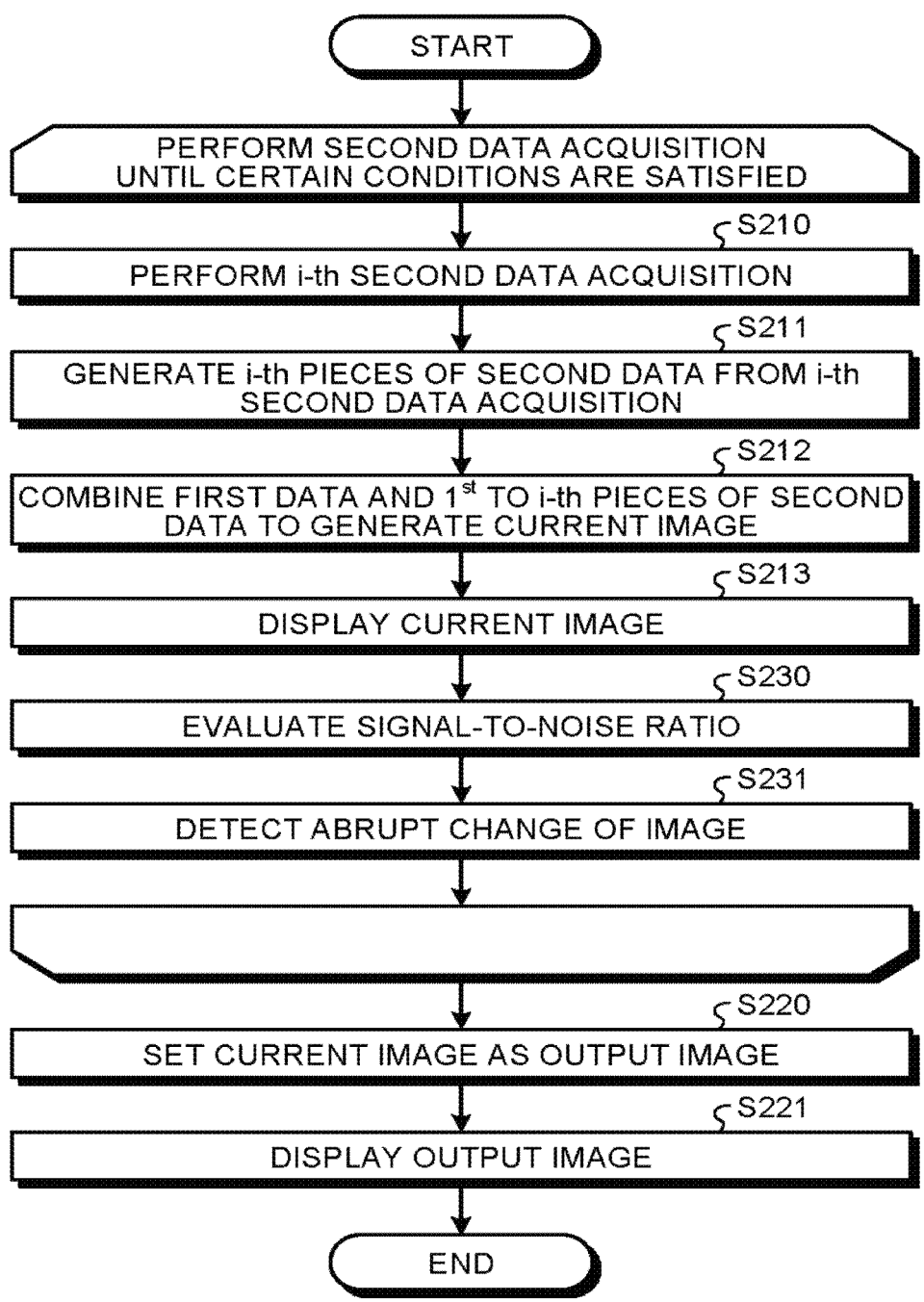
FIG. 11 is a flowchart illustrating a procedure of processing performed by a magnetic resonance imaging apparatus according to the fourth embodiment.

FIG. 11 is a flowchart illustrating a procedure of processing performed by a magnetic resonance imaging apparatus according to the fourth embodiment. Step S210, Step S211, Step S212, Step S213 and Step S220 in FIG. 11 are the same as those in FIG. 1C, so explanation is not repeated.

In FIG. 11, the sequence control circuitry 120 repeats the second data acquisition until certain conditions are satisfied. In other words, the processing circuitry 150 determines whether a certain condition is satisfied for each of the plurality of second data acquisition. The sequence control circuitry 120 repeats the second data acquisition until the processing circuitry determines that the certain condition is satisfied. The sequence control circuitry 120 terminates the second data acquisition when the processing circuitry 150 determines that the certain condition is satisfied.

As an example, the processing circuitry 150 evaluates the Signal to Noise Ratio (SNR) for each of the plurality of second data acquisition (Step S230).

In order for the processing circuitry 150 to evaluate the SNR (or the Contrast to Noise Ratio (CNR) to be described below), it is preferable that a pertinent ROI (Region of Interest) be determined prior to the evaluation of the SNR, on an image reconstructed by, for example, the first data. In such a case, for example, by the input device 24, the processing circuitry 150 accepts an input from the user regarding the configuration of the ROI to be used for the subsequent evaluation. The processing circuitry 150 determines the ROI to be used for the evaluation of the SNR based on the input from the user. The processing circuitry 150 performs the evaluation of the SNR, based on the ROI determined and an image reconstructed by, for example, the first data. In this way the value of the SNR is acquired.

Subsequently, for example, the processing circuitry 150 causes the display 135 to display the value of the SNR. For example, the display 135 displays, on the panel 65, a curve plotting the value of the SNR against the number of repetitions of the partial k-space data acquisition. The processing circuitry 150 determines that the certain condition is satisfied when the SNR exceeds a predetermined threshold. For example, if the predetermined threshold is 10, the processing circuitry 150 determines that the certain condition is satisfied when the SNR exceeds 10. In this case, the sequence control circuitry 120 terminates the second data acquisition (the partial k-space data acquisition). This threshold can be modified, for example, by the button 76 in FIG. 8.

Alternatively, the processing circuitry 150 evaluates a Contrast to Noise Ratio (CNR) for each of the plurality of second data acquisition. In this case, the processing circuitry 150 determines that the certain condition is satisfied when the CNR exceeds a predetermined threshold.

Additionally, the processing circuitry 150 detects an abrupt change of data or images for each of the plurality of second data acquisition (Step S231). The processing circuitry 150 determines that the certain condition is satisfied when the abrupt change is detected. If an abrupt change occurs, then the image should contain large motion artifacts. Thus the data thereafter should be discarded and not to be averaged.

More specifically, in a case in which the abrupt change (the deterioration) of the image occurs due to the motion of the subject and the like, the processing circuitry 150 specifies the time on which the change occurred, thereby specifying the images that are responsible for the image degradation. The processing circuitry 150 discards the images responsible for the image degradation and performs a reconstruction using other images. For example, the processing circuitry 150 uses, as the final output image, the previous image of the image that is the oldest image responsible for the image degradation. Usually, this image used for the reconstruction happens to be the previous image of the latest image when the further k-space data acquisition is terminated.

It is noted that the situation in which the previous image of the latest image when the data acquisition is terminated is used for the final output image is not limited to the case in which quantitative values are evaluated. On the contrary, it is readily applicable to a case in which the user observes the updated image in a real-time manner, recognizes the degradation of the image and the scan is thereby suspended manually.

In the fourth embodiment, the partial k-space data acquisition is terminated semi-automatically. A magnetic resonance imaging apparatus according to the fourth embodiment therefore improves user experiences.

Computer Programs

Further, the instructions presented in the processing procedures described in the above embodiments may be executed according to a computer program (hereinafter, "program") that is software. It is possible to achieve the same advantageous effects as those from the magnetic resonance imaging apparatus 100 in the above embodiments, by causing a general-purpose computer to store the program therein in advance and to read the program. The instructions described in the above embodiments are recorded as a computer-executable program onto a magnetic disk (e.g., a flexible disk, a hard disk), an optical disc (e.g., a Compact Disc Read-Only Memory [CD-ROM], a Compact Disc Recordable [CD-R], a Compact Disc Rewritable [CD-RW], a Digital Versatile Disk Read-Only Memory

[DVD-ROM], a Digital Versatile Disk Recordable [DVD±R], a Digital Versatile Disk Rewritable [DVD±RW]), a semiconductor memory, or the like. Any storage format can be used, as long as a computer or an incorporated system is able to read data from the storage medium. The computer is able to realize the same operations as those performed by the magnetic resonance imaging apparatus 100 described in the above embodiments, by reading the program from the recording medium and having the CPU execute the instructions written in the program according to the read program. Further, when obtaining or reading the program, the computer may obtain or read the program via a network.

Further, according to the instructions in the program installed from the storage medium into the computer or the incorporated system, an Operating System (OS) working in the computer, middleware (MW) such as database management software or a network may execute a part of the processes performed for realizing the embodiments described above. Further, the storage medium does not necessarily have to a medium that is independent of the computer or the incorporated system. The storage medium may be such a storage medium that stores therein or temporarily stores therein the downloaded program transferred via a Local Area Network (LAN), the Internet, or the like. Further, the storage medium does not necessarily have to be one. Even the situation where the processes described in the above embodiments are executed from a plurality of media is included in possible modes of the storage medium implementing the embodiments. The medium/media may have any configuration.

Further, the computer or the incorporated system used in any of the embodiments is configured to execute the processes described in the above embodiments according to the program stored in the storage medium. The computer or the incorporated system may be configured by using a single apparatus such as a personal computer or a microcomputer or may be configured by using a system in which a plurality of apparatuses are connected together via a network. Furthermore, the computer used in any of the embodiments does not necessarily have to be a personal computer and may be an arithmetic processing apparatus, a microcomputer, or the like included in an information processing device. The term "computer" generally refers to any device or apparatus that is capable of realizing the functions described in the embodiments by using the program.

A Hardware Configuration

Figure 12:
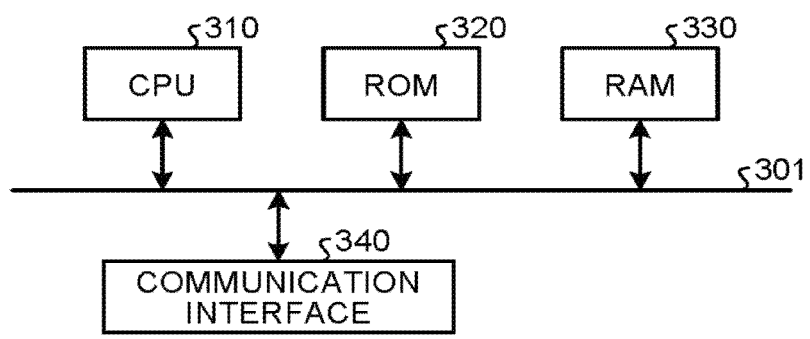
FIG. 12 is a diagram illustrating a hardware configuration of an image processing apparatus according to an embodiment.

FIG. 12 is a diagram of a hardware configuration of a computer 130 (image processing apparatus) according to an embodiment. The image processing apparatus according to the embodiments described above includes a controlling device such as a Central Processing Unit (CPU) 310, storage devices such as a Read-Only Memory (ROM) 320 and a Random Access Memory (RAM) 330, a communication interface (I/F) 340 that connects to a network and performs communication, and a bus 301 that connects the units together.

The program executed by the image processing apparatus according to the embodiments described above is provided as being incorporated, in advance, in the ROM 320 or the like. Further, the program executed by the image processing apparatus according to the embodiments described above is able to cause the computer to function as the its of the image processing apparatus described above. The computer is configured so that the CPU 310 is able to read the program from a computer-readable storage medium into a main storage device and to execute the read program.

According to a magnetic resonance imaging apparatus and a magnetic resonance imaging method according to at least one of the embodiments, it is possible to improve image quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
   sequence control circuitry configured to execute a pulse sequence to perform first data acquisition in a full k-space when an echo corresponding to the pulse sequence is formed, and configured to execute the pulse sequence to perform a plurality of second data acquisitions in partial k-spaces when the echo corresponding to the pulse sequence is formed, each of the partial k-spaces being smaller than an entirety of the full k-space, the first data acquisition being performed once; and
   processing circuitry configured to generate an image, based on data acquired from the first data acquisition and a plurality of pieces of data acquired from the plurality of second data acquisitions by combining the data acquired from the first data acquisition and all of the plurality of pieces of already-acquired data acquired from the plurality of second data acquisitions,
   wherein the processing circuitry is further configured to determine whether a certain condition is satisfied for each of the plurality of second data acquisitions and the sequence control circuitry is further configured to repeat the second data acquisitions until the processing circuitry determines that the certain condition is satisfied and the sequence control circuitry is configured to terminate the second data acquisitions when the processing circuitry determines that the certain condition is satisfied; and
   the processing circuitry is further configured to evaluate a Signal to Noise Ratio (SNR) for each of the plurality of second data acquisitions and configured to determine that the certain condition is satisfied when the SNR exceeds a predetermined threshold.

2. The magnetic resonance imaging apparatus according to claim 1, wherein the sequence control circuitry is configured to employ a partial Fourier technique during the first data acquisition.

3. The magnetic resonance imaging apparatus according to claim 1, wherein the full k-space is a 3D full k-space and each of the partial k-spaces is a 3D k-space having a smaller size than the 3D full k-space in at least one of a phase-encoding (PE) direction and a slice-encoding (SE) direction.

4. The magnetic resonance imaging apparatus according to claim 1, wherein the full k-space is a 3D full k-space and each of the partial k-spaces is a 3D k-space having a smaller size than the 3D full k-space in a phase-encoding (PE) direction and a slice-encoding (SE) direction.

5. The magnetic resonance imaging apparatus according to claim 1, wherein the sequence control circuitry is further configured to perform the first data acquisition and the plurality of second data acquisitions with at least one of a Spin Echo (SE) sequence, a Gradient Echo (GE) sequence, a Fast Spin Echo (FSE) sequence, a Single Shot Fast Spin Echo (SSFSE) sequence, a balanced Steady State Free Precession (bSSFP) sequence, an Echo Planar Imaging (EPI) sequence.

6. The magnetic resonance imaging apparatus according to claim 1, wherein the sequence control circuitry is further configured to perform the first data acquisition and the plurality of second data acquisitions with an Ultra Short Echo Time (UTE) sequence.

7. The magnetic resonance imaging apparatus according to claim 1, wherein the sequence control circuitry is further configured to perform at least one of the first data acquisition and the plurality of second data acquisitions with a plurality of reception coils, and the processing circuitry is further configured to use at least one of parallel imaging technique and Compressed Sensing (CS) to generate the image.

8. The magnetic resonance imaging apparatus according to claim 1, wherein the sequence control circuitry is further configured to perform a prospective motion correction during at least one of the first data acquisition and the plurality of second data acquisitions.

9. The magnetic resonance imaging apparatus according to claim 1, wherein the processing circuitry is further configured to perform a retrospective motion correction to generate the image.

10. The magnetic resonance imaging apparatus according to claim 1, wherein the processing circuitry is further configured to accept, from a user, prior to the plurality of second data acquisitions, an input of a number of repetitions in the plurality of second data acquisitions.

11. The magnetic resonance imaging apparatus according to claim 1, wherein the processing circuitry is further configured to accept, from a user, prior to the plurality of second data acquisitions, a size of the partial k-spaces in which the plurality of second data acquisitions is performed.

12. The magnetic resonance imaging apparatus according to claim 1, wherein the processing circuitry is further configured to generate a second image during the plurality of second data acquisitions, based on data acquired from the first data acquisition and one or more already-acquired pieces of data acquired from the plurality of second data acquisitions, and is configured to cause a display to display the second image.

13. The magnetic resonance imaging apparatus according to claim 1, wherein at least two of the partial k-spaces differ from each other.

14. The magnetic resonance imaging apparatus according to claim 1, wherein the processing circuitry is further configured to average the data acquired from the first data acquisition and the plurality of pieces of data acquired from the plurality of second data acquisitions, thereby generating the image.

15. The magnetic resonance imaging apparatus according to claim 1, wherein the processing circuitry is further configured to detect an abrupt change of data for each of the plurality of second data acquisitions and determine that the certain condition is satisfied when the abrupt change is detected.

16. The magnetic resonance imaging apparatus according to claim 1, wherein the pulse sequence is a spin echo pulse sequence and the echo is a spin echo.

17. A magnetic resonance imaging apparatus, comprising:
sequence control circuitry configured to perform first data acquisition in a full k-space, and configured to perform a plurality of second data acquisitions in partial k-spaces, each of the partial k-spaces being smaller than an entirety of the full k-space, the first data acquisition being performed once; and
processing circuitry configured to generate an image, based on data acquired from the first data acquisition and a plurality of pieces of data acquired from the plurality of second data acquisitions by combining the data acquired from the first data acquisition and all of the plurality of pieces of already-acquired data acquired from the plurality of second data acquisitions, wherein
the processing circuitry is further configured to determine whether a certain condition is satisfied for each of the plurality of second data acquisitions and the sequence control circuitry is configured to repeat the second data acquisitions until the processing circuitry determines that the certain condition is satisfied, and the sequence control circuitry is further configured to terminate the second data acquisitions when the processing circuitry determines that the certain condition is satisfied, and
wherein the processing circuitry is further configured to evaluate a Contrast to Noise Ratio (CNR) for each of the plurality of second data acquisitions and configured to determine that the certain condition is satisfied when the CNR exceeds a predetermined threshold.

18. The magnetic resonance imaging apparatus according to claim 17, wherein the processing circuitry is further configured to detect an abrupt change of data for each of the plurality of second data acquisitions and determine that the certain condition is satisfied when the abrupt change is detected.

19. A magnetic resonance imaging method executed by a magnetic resonance imaging apparatus, comprising:
performing first data acquisition in a full k-space and performing a plurality of second data acquisitions in partial k-spaces, each of the partial k-spaces being smaller than an entirety of the fill k-space, the first data acquisition being performed once; and
generating an image, based on data acquired from the first data acquisition and a plurality of pieces of data acquired from the plurality of second data acquisitions by combining the data acquired from the first data acquisition and all of the plurality of pieces of already-acquired data acquired from the plurality of second data acquisitions,
wherein the magnetic resonance imaging method further comprises:
determining whether a certain condition is satisfied for each of the plurality of second data acquisitions,
repeating the second data acquisitions until determining that the certain condition is satisfied, and
terminating the second data acquisitions when determining that the certain condition is satisfied, and
wherein the magnetic resonance imaging method further comprises evaluating a Signal to Noise Ratio (SNR) for each of the plurality of second data acquisitions, and determining that the certain condition is satisfied when the SNR exceeds a predetermined threshold.

* * * * *